(12) United States Patent
Zhou et al.

(10) Patent No.: US 12,205,019 B2
(45) Date of Patent: Jan. 21, 2025

(54) DATA LAYOUT CONSCIOUS PROCESSING IN MEMORY ARCHITECTURE FOR EXECUTING NEURAL NETWORK MODEL

(71) Applicant: ALIBABA GROUP HOLDING LIMITED, George Town (KY)

(72) Inventors: Minxuan Zhou, San Mateo, CA (US); Weifeng Zhang, San Mateo, CA (US); Guoyang Chen, San Mateo, CA (US)

(73) Assignee: Alibaba Group Holding Limited, Grand Cayman (KY)

( * ) Notice: Subject to any disclaimer, the term of this patent is extended or adjusted under 35 U.S.C. 154(b) by 1277 days.

(21) Appl. No.: 16/688,889

(22) Filed: Nov. 19, 2019

(65) Prior Publication Data
US 2021/0150311 A1    May 20, 2021

(51) Int. Cl.
*G06N 3/065* (2023.01)
*G06F 15/78* (2006.01)
(Continued)

(52) U.S. Cl.
CPC ......... *G06N 3/065* (2023.01); *G06F 15/7821* (2013.01); *G06N 3/04* (2013.01); *G11C 16/10* (2013.01)

(58) Field of Classification Search
None
See application file for complete search history.

(56) References Cited

U.S. PATENT DOCUMENTS 4,855,957 A * 8/1989 Nogami ............... G11C 7/10
365/189.04

5,155,802 A * 10/1992 Mueller ................. G06N 3/063
706/26
(Continued)

FOREIGN PATENT DOCUMENTS

CN    101510008 A    8/2009
CN    107578098 A    1/2018
(Continued)

OTHER PUBLICATIONS

J. Zhang, Z. Wang and N. Verma, "In-Memory Computation of a Machine-Learning Classifier in a Standard 6T SRAM Array," in IEEE Journal of Solid-State Circuits, vol. 52, No. 4, pp. 915-924, Apr. 2017, doi: 10.1109/JSSC.2016.2642198. (Year: 2017).*
(Continued)

*Primary Examiner* — James D. Rutten
(74) *Attorney, Agent, or Firm* — Finnegan, Henderson, Farabow, Garrett & Dunner, LLP

(57) ABSTRACT

The present disclosure relates to a processing in memory (PIM) enabled device for executing a neural network model. The PIM enabled device comprises a memory block assembly comprising a first array of memory blocks, a second array of memory blocks adjacent to the first array of memory blocks, a plurality of first data links associated with the first array of memory blocks and the second array of memory blocks, wherein each data link of the plurality of first data links communicatively couples two corresponding memory blocks of which are from the first array of memory blocks and the second array of memory blocks respectively, and a second data link communicatively coupled to the plurality of first data links. The data from a first memory block of the first array of memory blocks can be transferable to a second memory block of the second array of memory blocks via the plurality of first data links and the second data link.

29 Claims, 12 Drawing Sheets

(51) Int. Cl.
*G06N 3/04* (2023.01)
*G11C 16/10* (2006.01)

(56) References Cited

U.S. PATENT DOCUMENTS

| | | | | |
|---|---|---|---|---|
| 5,870,347 | A * | 2/1999 | Keeth | G11C 8/12 |
| | | | | 365/230.06 |
| 2003/0048787 | A1* | 3/2003 | Glaise | H04L 49/15 |
| | | | | 370/392 |
| 2006/0104364 | A1* | 5/2006 | Kim | H04N 19/423 |
| | | | | 375/E7.266 |
| 2011/0208905 | A1* | 8/2011 | Shaeffer | G11C 16/10 |
| | | | | 711/E12.008 |
| 2013/0151877 | A1* | 6/2013 | Kadri | G06F 1/3203 |
| | | | | 713/320 |
| 2016/0004477 | A1* | 1/2016 | Okada | G06F 13/1605 |
| | | | | 710/5 |
| 2016/0313941 | A1* | 10/2016 | Suzuki | G06F 1/3287 |
| 2018/0033479 | A1* | 2/2018 | Lea | G11C 11/4082 |
| 2018/0275883 | A1* | 9/2018 | Lea | G11C 11/4097 |
| 2019/0065111 | A1 | 2/2019 | Lea et al. | |
| 2019/0138890 | A1 | 5/2019 | Liang et al. | |
| 2019/0228307 | A1* | 7/2019 | Lee | G06N 3/045 |
| 2020/0007114 | A1* | 1/2020 | Kimura | H03K 17/693 |

FOREIGN PATENT DOCUMENTS

| | | | |
|---|---|---|---|
| CN | 108133269 | A | 6/2018 |
| CN | 108228094 | A | 6/2018 |
| CN | 108388498 | A | 8/2018 |
| CN | 109542835 | A | 3/2019 |
| KR | 20050106582 | A | 11/2005 |
| WO | WO-2017006512 A1 * | 1/2017 | ............... G06N 3/04 |

OTHER PUBLICATIONS

S. Gupta, M. Imani, H. Kaur and T. S. Rosing, "NNPIM: A Processing In-Memory Architecture for Neural Network Acceleration," in IEEE Transactions on Computers, vol. 68, No. 9, pp. 1325-1337, Sep. 1, 2019, doi: 10.1109/TC.2019.2903055. (Year: 2019).*

Shafiee, Ali et al. "ISAAC: A Convolutional Neural Network Accelerator with In-Situ Analog Arithmetic in Crossbars", Proceedings of the 43$^{rd}$ International Symposium on Computer Architecture, 2016, 13 pages.

Chi, Ping et al. "PRIME: A Novel Processing-In-Memory Architecture for Neural Network Computation in ReRAM-Based Main Memory", Proceedings of the 43$^{rd}$ International Symposium on Computer Architecture, 2016, 13 pages.

Song, Linghao et al. "A Pipelined ReRAM-Based Accelerator for Deep Learning", High Performance Computer Architecture (HPCA), 2017, 13 pages.

Imani, Mohsen, et al. "FloatPIM: In-Memory Acceleration of Deep Neural Network Training with High Precision", Proceedings of the 46$^{rd}$ International Symposium on Computer Architecture, 2019, pp. 802-815.

Chinese Search Report issued in corresponding Chinese Application No. 202011305314.4 (3 pages), Jan. 15, 2024.

Imani et al., "FloatPIM: In-Memory Acceleration of Deep Neural Network Training with High Precision," ISCA, Jun. 22-26, 2019, pp. 802-815.

* cited by examiner

| Src | Dst | Bfr |
|---|---|---|
| ... | ... | ... |

| State | #Rec | #Send |
|-------|------|-------|
| ... | ... | |

DATA LAYOUT CONSCIOUS PROCESSING IN MEMORY ARCHITECTURE FOR EXECUTING NEURAL NETWORK MODEL

BACKGROUND

Machine learning has been widely used in various areas including natural language processing, speech recognition, image classification, etc. In machine learning, neural network models have been constantly increasing and becoming more complicated. As neural network models, especially deep neural network (DNN) models, become large and complex with hundreds of layers and millions of weights, executing neural network models becomes not only computation heavy but also memory intensive. Because conventional Von Neumann architecture has separate processing units and memory units, a large amount of data transfers between the processing units and memory units occur when processing neural network models on conventional Von Neumann architecture, which becomes a bottleneck in processing the neural network models.

Processing In-Memory (PIM) technology, which enables computation to be performed in memory units, has emerged to resolve such problems by reducing data movements between processing units and memory units. However, data or memory alignment suitable for executing neural network models on PIM architecture is important to reduce unnecessary data movement inside memory units, to increase memory utilization, and to improve overall performance.

SUMMARY OF THE DISCLOSURE

Embodiments of the present disclosure provide a processing in memory (PIM) enabled device for executing a neural network model. The PIM enabled device comprises a memory block assembly comprising a first array of memory blocks, a second array of memory blocks adjacent to the first array of memory blocks, a plurality of first data links associated with the first array of memory blocks and the second array of memory blocks, wherein each data link of the plurality of first data links communicatively couples two corresponding memory blocks of which are from the first array of memory blocks and the second array of memory blocks respectively, and a second data link communicatively coupled to the plurality of first data links. The data from a first memory block of the first array of memory blocks can be transferable to a second memory block of the second array of memory blocks via the plurality of first data links and the second data link.

Embodiments of the present disclosure also provide a method for executing a neural network model on a processing in memory (PIM) enabled device comprising a memory block assembly. The method can comprise processing a first operation of the neural network model on a first memory block of a first array of memory blocks in the memory block assembly, transferring output data from the first memory block to a second memory block of a second array of memory blocks in the memory block assembly via data links communicatively coupling the first memory block and the second memory in the memory block assembly, and processing, on the second memory block, a second operation of the neural network model based on the output data.

Embodiments of the present disclosure also provide a non-transitory computer readable storage media storing a set of instructions that are executable by at least one processor of processing in memory (PIM) enabled terminal to cause the terminal to perform a method. The method can comprise processing a first operation of the neural network model on a first memory block of a first array of memory blocks in a memory block assembly, transferring output data from the first memory block to a second memory block of a second array of memory blocks in the memory block assembly via data links communicatively coupling the first memory block and the second memory in the memory block assembly, and processing, on the second memory block, a second operation of the neural network model based on the output data.

Embodiments of the present disclosure also provide a terminal comprising a host unit and a processing in memory (PIM) enabled device communicatively coupled to the host unit. The PIM enabled device can comprise a memory block assembly comprising a first array of memory blocks, a second array of memory blocks adjacent to the first array of memory blocks, a plurality of first data links associated with the first array of memory blocks and the second array of memory blocks, wherein each data link of the plurality of first data links communicatively couples two corresponding memory blocks of which are from the first array of memory blocks and the second array of memory blocks respectively, and a second data link communicatively coupled to the plurality of first data links. Data from a first memory block of the first array of memory blocks can be transferable to a second memory block of the second array of memory blocks via the plurality of first data links and the second data link.

Additional features and advantages of the disclosed embodiments will be set forth in part in the following description, and in part will be apparent from the description, or may be learned by practice of the embodiments. The features and advantages of the disclosed embodiments may be realized and attained by the elements and combinations set forth in the claims.

It is to be understood that both the foregoing general description and the following detailed description are exemplary and explanatory only and are not restrictive of the disclosed embodiments, as claimed.

BRIEF DESCRIPTION OF THE DRAWINGS

FIG. 5A illustrates an exemplary data transfer table for recording data transfer, consistent with embodiments of the present disclosure.

FIG. 5B illustrates an exemplary block table for recording a memory block status, consistent with embodiments of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Figure 1:
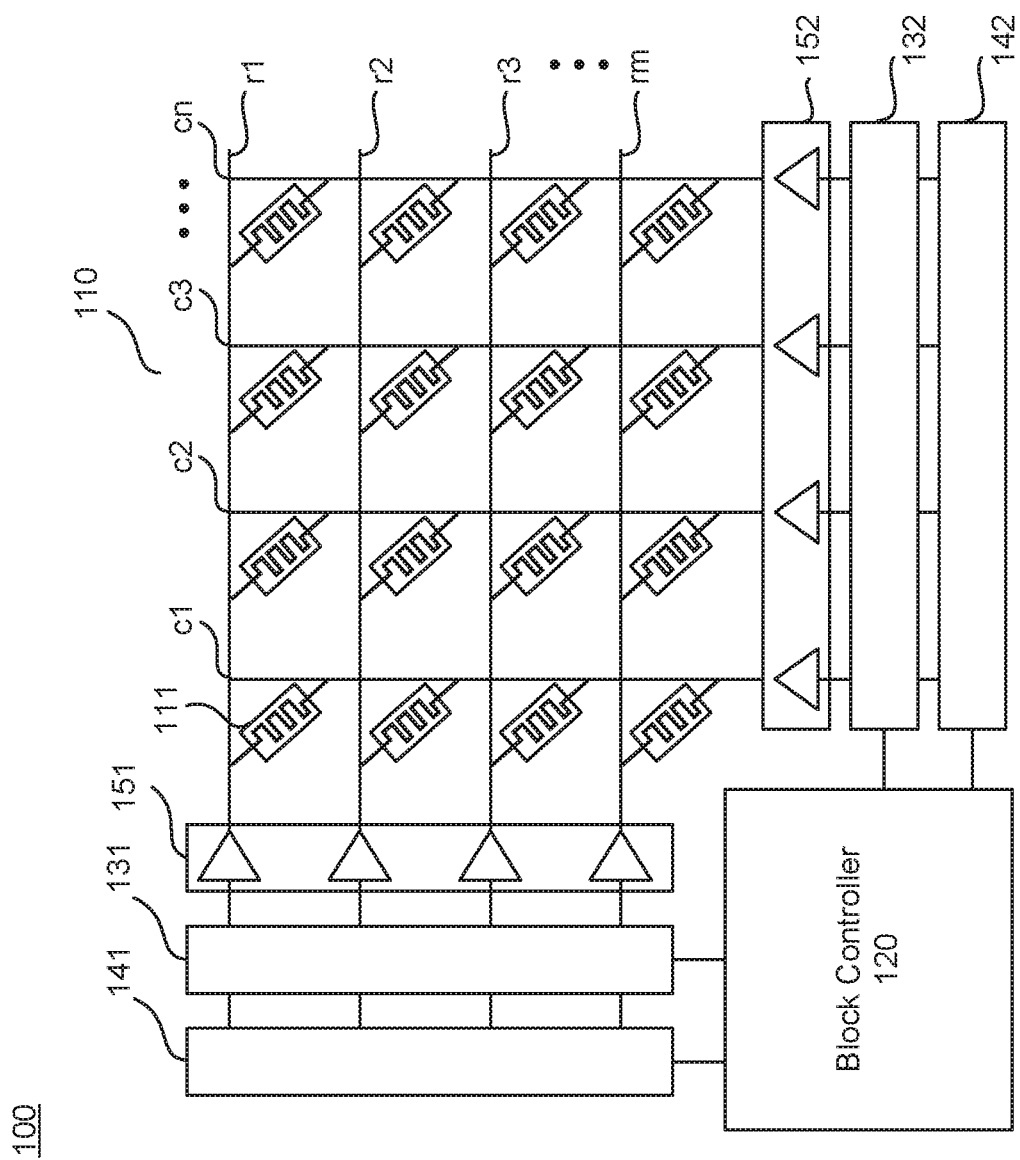
FIG. 1 illustrates an exemplary processing in memory block configuration, consistent with embodiments of the present disclosure.

FIG. 1 illustrates an exemplary processing in memory (PIM) block configuration, consistent with embodiments of the present disclosure. PIM block 100 includes a memory cell array 110, a block controller 120, a block row driver 131, and a block column driver 132. Although some embodiments will be illustrated using ReRAM (resistive random access memory) as examples, it will be appreciated that PIM block 100 according to embodiments of the present disclosure can be implemented based on various memory technologies including DRAM (dynamic random access memory), SRAM (static random access memory), ReRAM, etc.

Memory cell array 110 may include m number of rows $r_1$ to $r_m$ and n number of columns $c_1$ to $c_n$. As shown in FIG. 1, a crossbar memory 111 can be connected between each of m number of rows $r_1$ to $r_m$ and each of n number of columns $c_1$ to $c_n$. In some embodiments, data can be stored as multi-bit mersisters in crossbar memory 111.

Block row driver 131 and block column driver 132 may provide signals such as voltage signals to m number of rows $r_1$ to $r_m$ and n number of columns $c_1$ to $c_n$ for processing corresponding operations. In some embodiments, block row driver 131 and block column driver 132 may be configured to pass analog signals through crossbar memory 111. In some embodiments, the analog signals may have been converted from digital input data.

Block controller 120 may include an instruction register for storing instructions. In some embodiments, instructions may include instructions of when block row driver 131 or block column driver 132 provide signals to a corresponding column or row, which signals are to be provided, etc. Block controller 120 can decode instructions stored in the register into signals to be used by block row driver 131 or block column driver 132.

PIM block 100 may further include a row sense amplifier 141 or a column sense amplifier 142 for read out data from a memory cell or for storing the data into a memory cell. In some embodiments, row sense amplifier 141 and column sense amplifier 142 may store data for buffering. In some embodiments, PIM block 100 can further include DAC 151 (digital-to-analog converter) or ADC 152 (analog-to-digital converter) to convert input signal or output data between analog domain and digital domain. In some embodiments of the present disclosure, row sense amplifier 141 or column sense amplifier 142 can be omitted because computations in PIM block 100 may be performed directly on the stored values in the memory cell without reading the values out or without using any sense amplifier.

According to embodiments of the present disclosure, PIM block 100 enables parallel computing by using memories as multiple SIMD (single instruction, multiple data) processing units. PIM block 100 may support computational operations including bit-wise operations, additions, subtractions, multiplications, and divisions for both integer and floating-point values. For example, in memory cell array 110 of FIG. 1, a first column $c_1$ and a second column $c_2$ can store a first vector A and a second vector B, respectively. A vector operation result C from the addition of vectors A and B can be stored in a third column c3 by applying formatted signals to the first to third columns $c_1$ to $c_3$ and corresponding rows for a length of the vectors A, B, and C. Similarly, memory cell array 110 of FIG. 1 can also support vector multiplication and addition operation. For example, computation C=aA+bB can be performed by applying a voltage signal corresponding to a multiplier a to a first column c1 and a voltage signal corresponding to a multiplier b to a second column c2 and by applying formatted signals to corresponding columns and rows to perform addition and to save a result C in a third column c3.

In some embodiments, one vector can be stored in multiple columns for representing n-bit values for elements. For example, one vector of which element has 2-bit values can be stored in two columns of memory cells. In some embodiments, when the length of a vector exceeds the number of rows of memory cell array 110, which constitutes a memory block, the vector may be stored in multiple memory blocks. The multiple memory blocks may be configured to compute different vector segments in parallel. While embodiments in which PIM architecture performs computational operations without using arithmetic logics addition to memory cells, the present disclosure may also apply to PIM architecture including arithmetic logics for performing arithmetic operations in PIM architecture.

PIM architecture can be used in processing neural network models to address data movement overhead between processing units and memory units. As shown before, computational operations such as addition, multiplication, etc., can also be performed as column-wise vector calculations in PIM architecture, it is important to align data properly before processing such operations in memory to reduce unnecessary data movement in memory and to maximize utilization of a computing capacity of PIM architecture. The disclosed embodiments provide a PIM accelerator architecture enabling efficient data alignment when processing neural network models. The disclosed embodiments provide a data layout conscious PIM accelerator architecture for improving execution efficiency of neural network models.

Figure 2A:
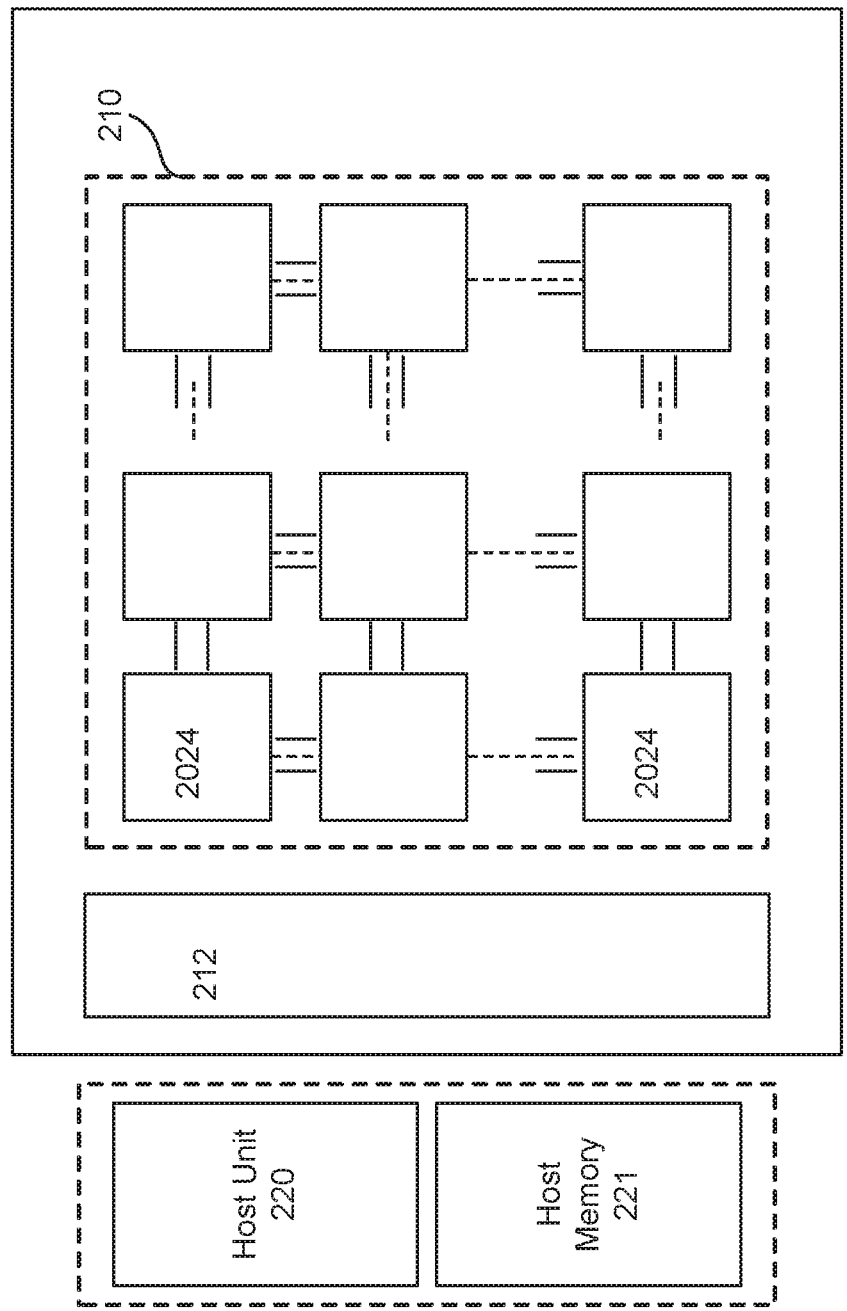
FIG. 2A illustrates an exemplary neural network accelerator architecture, consistent with embodiments of the present disclosure.

FIG. 2A illustrates an exemplary neural network accelerator architecture 200, consistent with embodiments of the present disclosure. In the context of this disclosure, a neural network accelerator may also be referred to as a machine learning accelerator or deep learning accelerator. In some embodiments, accelerator architecture 200 may be referred to as a neural network processing unit (NPU) architecture 200. As shown in FIG. 2A, accelerator architecture 200 can include a PIM accelerator 210, an interface 212, and the like. It is appreciated that, PIM accelerator 210 can perform algorithmic operations based on communicated data.

PIM accelerator 210 can include one or more memory tiles 2024. In some embodiments, memory tiles 2024 can include a plurality of memory blocks for data storage and computation. A memory block can be configured to perform one or more operations (e.g., multiplication, addition, multiply-accumulate, etc.) on the communicated data. In some embodiments, each of memory blocks included in memory tile 2024 may have the same configuration of PIM block 100 shown in FIG. 1. Due to a hierarchical design of PIM accelerator 210, PIM accelerator 210 can provide generality and scalability. PIM accelerator 210 may comprise any number of memory tiles 2024 and each memory tile 2024 may have any number of memory blocks.

Interface 221 (such as a PCIe interface) serves as an (and typically the) inter-chip bus, providing communication between the PIM accelerator 210 and the host unit 220. The inter-chip bus connects the PIM accelerator 210 with other devices, such as the off-chip memory or peripherals. In some embodiments, accelerator architecture 200 can further include a DMA unit (not shown) that assists with transferring data between host memory 221 and PIM accelerator 210. In addition, DMA unit can assist with transferring data between multiple accelerators. DMA unit can allow off-chip devices to access both on-chip and off-chip memory without causing a host CPU interrupt. Thus, DMA unit can also generate memory addresses and initiate memory read or write cycles. DMA unit also can contain several hardware registers that can be written and read by the one or more processors, including a memory address register, a byte-count register, one or more control registers, and other types of registers. These registers can specify some combination of the source, the destination, the direction of the transfer (reading from the input/output (I/O) device or writing to the I/O device), the size of the transfer unit, and/or the number of bytes to transfer in one burst. It is appreciated that accelerator architecture 200 can include a second DMA unit, which can be used to transfer data between other accelerator architecture to allow multiple accelerator architectures to communicate directly without involving the host CPU.

While accelerator architecture 200 of FIG. 2A is explained to include PIM accelerator 210 having memory blocks (e.g., PIM memory block 100 of FIG. 1), it is appreciated that the disclosed embodiments may be applied to any type of memory blocks, which support arithmetic operations, for accelerating some applications such as deep learning.

Accelerator architecture 200 can also communicate with a host unit 220. Host unit 220 can be one or more processing unit (e.g., an X86 central processing unit). PIM accelerator 210 can be considered as a coprocessor to host unit 220 in some embodiments.

As shown in FIG. 2A, host unit 220 may be associated with host memory 221. In some embodiments, host memory 221 may be an integral memory or an external memory associated with host unit 220. Host memory 221 may be a local or a global memory. In some embodiments, host memory 221 may comprise host disk, which is an external memory configured to provide additional memory for host unit 220. Host memory 221 can be a double data rate synchronous dynamic random-access memory (e.g., DDR SDRAM) or the like. Host memory 221 can be configured to store a large amount of data with slower access speed, compared to the on-chip memory of PIM accelerator 210, acting as a higher level cache. The data stored in host memory 221 may be transferred to PIM accelerator 210 to be used for executing neural network models.

In some embodiments, a host system having host unit 220 and host memory 221 can comprise a compiler (not shown). The compiler is a program or computer software that transforms computer codes written in one programming language into instructions to create an executable program. In machine learning applications, a compiler can perform a variety of operations, for example, pre-processing, lexical analysis, parsing, semantic analysis, conversion of input programs to an intermediate representation, code optimization, and code generation, or combinations thereof.

In some embodiments, the compiler may push one or more commands to host unit 220. Based on these commands, host unit 220 can assign any number of tasks to one or more memory tiles (e.g., memory tile 2024) or processing elements. Some of the commands may instruct a DMA unit to load instructions and data from host memory (e.g., host memory 221 of FIG. 2A) into accelerator (e.g., PIM accelerator 210 of FIG. 2A). The instructions may be loaded to each memory tile (e.g., memory tile 2024 of FIG. 2A) assigned with the corresponding task, and the one or more memory tiles may process these instructions.

It is appreciated that the first few instructions may instruct to load/store data from the host memory 221 into one or more local memories of the memory tile. Each memory tile may then initiate the instruction pipeline, which involves fetching the instruction (e.g., via a fetch unit) from the local memory, decoding the instruction (e.g., via an instruction decoder) and generating local memory addresses (e.g., corresponding to an operand), reading the source data, executing or loading/storing operations, and then writing back results.

Figure 2B:
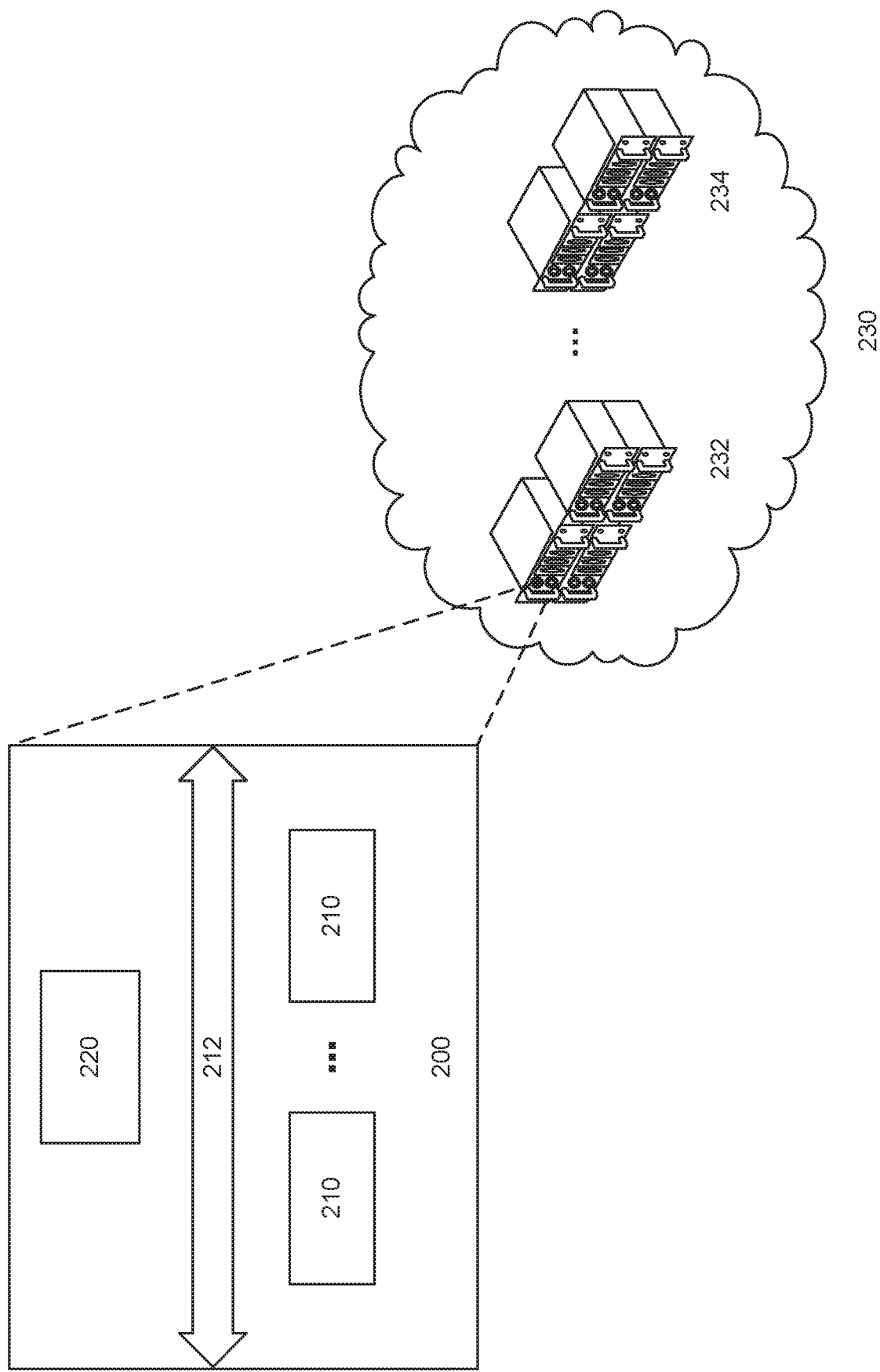
FIG. 2B illustrates a schematic diagram of an exemplary cloud system incorporating a neural network accelerator architecture, consistent with embodiments of the present disclosure.

FIG. 2B illustrates a schematic diagram of an exemplary cloud system incorporating a neural network accelerator architecture, consistent with embodiments of the present disclosure. As shown in FIG. 2B, cloud system 230 can provide cloud service with artificial intelligence (AI) capabilities and can include a plurality of computing servers (e.g., 232 and 234). In some embodiments, a computing server 232 can, for example, incorporate a neural network accelerator architecture 200 of FIG. 2A. Neural network accelerator architecture 200 is shown in FIG. 2B in a simplified manner for simplicity and clarity.

With the assistance of a neural network accelerator architecture 200, cloud system 230 can provide the extended AI capabilities of image recognition, facial recognition, translations, 3D modeling, and the like. It is appreciated that, neural network accelerator architecture 200 can be deployed to computing devices in other forms. For example, neural network accelerator architecture 200 can also be integrated in a computing device, such as a smart phone, a tablet, and a wearable device.

Figure 3:
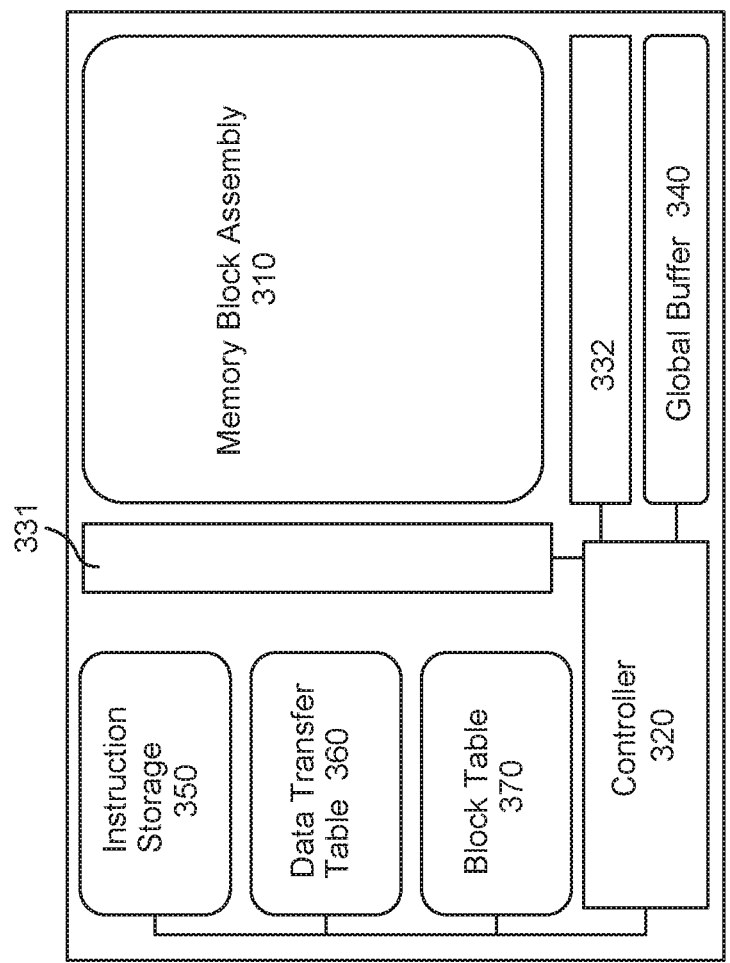
FIG. 3 illustrates an exemplary memory tile configuration, consistent with embodiments of the present disclosure.

FIG. 3 illustrates an exemplary memory tile configuration, consistent with embodiments of the present disclosure. A memory tile 300 may include a memory block assembly 310, a controller 320, a row driver 331, a column driver 332, and a global buffer 340.

Memory block assembly 310 may include a plurality of memory blocks arranged in a two-dimensional mesh consistent with embodiments of the present disclosure, which will be explained in detail referring to FIG. 4 later.

Controller 320 can provide commands to each memory block in memory block assembly 310 via row driver 331, column driver 332, and global buffer 340. Row driver 331 is connected to each row of memory blocks in memory block assembly 310 and column driver 332 is connected to each column of memory blocks in memory block assembly 310. In some embodiments, block controller (e.g., block controller 120 in FIG. 1) included in each memory block may be configured to receive commands via row drive 331 or column driver 332 from the controller 320 and to issue signals to a block row driver (e.g., block row driver 131 in FIG. 1) and a block column driver (e.g., block column driver 132 in FIG. 1) to perform corresponding operations in memory. According to embodiments of the present disclosure, memory blocks can perform different operations independently by using block controllers in memory blocks of memory block assembly 310, and thus block-level parallel processing can be performed. Data can be efficiently transferred among memory cells arranged in rows and in columns in the corresponding memory block by the block controller.

In some embodiments, global buffer 340 can be used to transfer data between memory blocks in memory block assembly 310. For example, controller 320 can use global buffer 340 when transferring data from one memory block to another memory block in memory block assembly 310. According to some embodiments of the present disclosure, global buffer 340 can be shared by all memory blocks in memory block assembly 310. Global buffer 340 can be configured to store commands for each memory block to process assigned tasks in processing neural network model. In some embodiments, controller 320 is configured to send commands stored in global buffer 340 to corresponding memory blocks via row driver 331 and column driver 332. In some embodiments, such commands can be transferred from host unit (e.g., host unit 220 of FIG. 2A). Global buffer 340 can be configured to store and send data to be used for processing assigned tasks to memory blocks. In some embodiments, the data stored in and sent from global buffer 340 can be transferred from host unit (e.g., host unit 220 of FIG. 2A) or other memory blocks in memory block assembly 310. In some embodiments, controller 320 is configured to store data from memory blocks in memory block assembly 310 into global buffer 340. In some embodiments, controller 320 can receive and store data of an entire row of one memory block in memory block assembly 310 into global buffer 340 in one cycle. Similarly, controller 320 can send data of an entire row from global buffer 340 to another memory block in one cycle.

Figure 4:
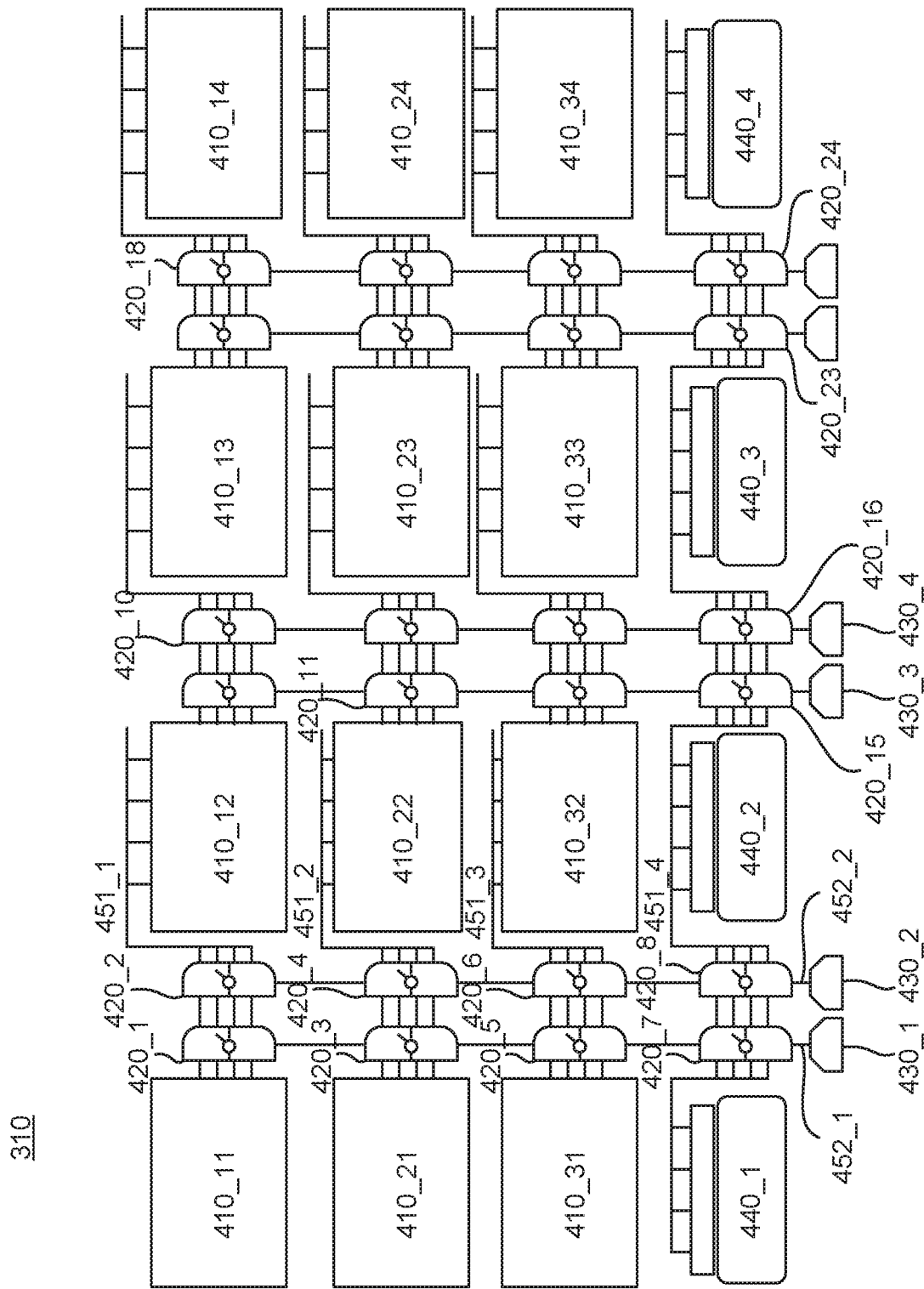
FIG. 4 illustrates an exemplary memory block assembly in memory tile, consistent with embodiments of the present disclosure.

Reference is now made to FIG. 4 illustrating an exemplary memory block assembly 310 in memory tile 300 consistent with embodiments of the present disclosure. Memory block assembly 310 may include a plurality of memory blocks 410, a plurality of switches 420, and a plurality of selectors 430.

According to embodiments of the present disclosure, operations for processing neural network models in PIM architecture can be transformed to in-memory column-wise vector calculations. In-memory column-wise vector calculations, output data of a certain neural network layer or neural network operation may be stored as a set of column-wise vectors in memory block. 410. Memory block assembly 310 can be configured to support or facilitate column-wise vector calculation in order to minimize unnecessary data movements within memory block assembly 310 and to maximize memory utilization while executing neural network models. In some embodiments, a plurality of memory blocks 410 in memory block assembly 310 can be interconnected to facilitate data movement between memory blocks, which enables the memory block assembly 310 to be suitable and efficient for processing vector calculations. A plurality of memory blocks 410 can be arranged in a 2D mesh. In some embodiments, a plurality of memory blocks 410 can be arranged in M number of rows and N number of columns in memory block assembly 310, where M and N are natural numbers greater than 1. Each memory block 410 may be positioned at each intersection of rows and columns. While FIG. 4 illustrates that 12 memory blocks 410_11 to 410_34 are arranged in 3 rows and 4 columns as an example, it will be appreciated that memory block assembly 310 can have any number of memory blocks and can be arranged in any manner. In some embodiments, each memory block 410 can be PIM block (e.g., PIM block 100 of FIG. 1). In some embodiments, memory block 410 is a basic computation unit for performing various in-memory operations.

According to embodiments of the present disclosure, a row data link 451 interconnects two adjacent memory blocks in the same row among a plurality of memory blocks 410. For example, as shown in FIG. 4, first memory block 410_11 and second memory block 410_12 placed adjacent in a first row are connected with row data link 451_1 and fifth memory block 410_21 and sixth memory block 410_22 placed adjacent in a second row are connected with row data link 451_2. Similarly, two adjacent memory blocks in the same row can be interconnected with their own row data link.

According to embodiments of the present disclosure, memory block assembly 310 may further include a column data link connecting a plurality of data links positioned between two adjacent columns of memory blocks among the plurality of memory blocks 410. For example, as shown in FIG. 4, two column data links 452_1 and 452_2 connect three row data links 451_1 to 451_3 that are positioned between the first column of memory blocks 410_11 to 410_31 and the second column of memory blocks 410_12 to 410_32. In some embodiments, via column data links 452 and row data links 451 between two adjacent columns of memory blocks, one column of memory blocks among the two adjacent columns of memory blocks can share data with the other column of memory blocks. For example, column data links 452_1 or 452_2 enable the first column of memory blocks 410_11 to 410_31 to share data with the entire second column of memory blocks 410_12 to 410_31 by cooperating with row data links 451_1 to 451_3.

According to embodiments of the present disclosure, switches 420 can be provided for each row data link 451. For example, a first switch 420_1 and a second switch 420_2 can be provided for row data link 451_1 and a third switch 420_3 and a fourth switch 420_4 can be provided for row data link 451_2. In some embodiments, each switch 420 is configured to open or close a data path from/to an adjacent memory block to the switch 420 in the same row to/from the corresponding data link 451. For example, when first switch 420_1 is turned on, a data path from first memory block 410_11 to row data link 451_1 is open. In this example, data from first memory block 410_11 can be transferred through row data links 451_1, 451_2, and 451_3 and column data links 452_1 and 452_2. In the same example, when second switch 420_2 is turned on, a data path from row data link 451_1 to second memory block 410_12 is open. In this example, the data shared through row data links 451_1, 451_2, and 451_3 and column data links 452_1 and 452_2 can be transferred to the second memory block 410_2.

According to some embodiments of the present disclosure, a selector 430 is provided for a plurality of switches in the same column. For example, a selector 430_1 is provided for a first column of switches 420_1, 420_3, and 420_5 and a selector 430_2 is provided for a second column of switches 420_2, 420_4, and 420_6. In some embodiments, selector 430 can be configured to select switch to turn on among the plurality of switches in the corresponding column. For example, selector 430_1 can be configured to select switch among the plurality of switches 420_1, 420_3, and 420_5 in the first column to turn on and selector 430_2 can be configured to select switch among the plurality of switches 420_2, 420_4, and 4206 in the second column to turn on.

When data from first memory block 410_11 needs to be transferred to $10^{th}$ memory block 410_32, selector 430_1 may select first switch 420_1 to turn on and selector 430_2 may select sixth switch 420_6 to turn on. In this example, a data path from first memory block 410 to row data link 451_1 is open by turning on the first switch 420_1 and data from the first memory block 410 is accessible to a second column of memory blocks 410_12, 410_22, and 410_32 via two column data links 452_1 and 452_2 and row data links 451_1, 451_2, and 451_3. Because only the sixth switch 420_6 is selected to turn on and thus a data path from row data link 451_3 to $10^{th}$ memory block 410_32 is open, the data from the first memory block 410 can be transferred to the $10^{th}$ memory block 410_32.

According to some embodiments of the present disclosure, one memory block to multiple memory blocks data transfer can be supported. Selector 430 controlling a data path from row data link 451 to adjacent memory block 410 may select more than one switch at a time (e.g., in one cycle) to transfer data to multiple memory blocks 410. For example, in the above example, selector 430_2 may select second switch 420_2 and sixth switch 420_6 to transfer data from the first memory block 410_11 to two memory blocks 410_12 and 410_32 at a same cycle. In the present disclosure, embodiments in which one switch is selected in one cycle will be explained. In these embodiments, data transfer from one memory block to many memory blocks (aka 'one to many' data transfer) may be performed during multiple cycles. For example, in the above example, selector 430_2 may select second switch 420_2 in a first cycle and sixth switch 420_6 in a second cycle while selector 430_1 selects first switch 420_1 in the first and second cycles to transfer data from first memory block 410_11 to two memory blocks 410_12 and 410_32.

According to some embodiments, when data is transferred from one memory block to another memory block, values stored in one column of memory cells in the transferring memory block can be stored in one row of memory cells in the receiving memory block. For example, when data is transferred from first memory block 410_11 to $10^{th}$ memory block 410_32, values stored in one column of memory cells (e.g., a column of memory cells storing an output vector) in the first memory block 410_11 can be stored in one row of memory cells in the $10^{th}$ memory block 410_32. In some embodiments, data from an entire column of memory cells in memory block (e.g., 410_11) can be transferred to one or more neighboring memory blocks (e.g., 410_12 and 410_32) in one cycle. In some embodiments, transfer latency may depend on the size of each element in a vector.

As discussed above, operations for processing neural network models in PIM architecture can be transformed to in-memory column-wise vector calculations. In-memory column-wise vector calculations, output data of a certain neural network layer or neural network operation may be stored as a set of column-wise vectors in memory block. According to some embodiments of the present disclosure, global buffer 340 may be suitable for transferring data stored in a row of memory cells and may show optimal performance when entire data stored in one row of memory cells are moved at one cycle. Transferring a column-wise vector through global buffer 340 may require a sequence of transfers for each element of the vector. Moving data through global buffer 340 shared with all the memory blocks 410 may cause serious conflicts, which may degrade the system throughput. According to embodiments of the present disclosure, via data links 451 and 452, data transfer between neighboring memory blocks can be performed without using global buffer 340, which improves data transfer performance between neighboring memory blocks as well as overall throughput in executing neural network models on PIM accelerator 210.

According to embodiments of the present disclosure, memory block assembly 310 may further include a transfer buffer 440 for transferring data between non-neighboring memory blocks 410. In some embodiments, transfer buffer 440 can be provided to a column of memory blocks. For example, a first transfer buffer 440_1 may be provided to a first column of memory blocks 410_11, 410_21, and 410_31, a second transfer buffer 440_2 may be provided to a second column of memory blocks 410_12, 410_22, and 410_32, a third transfer buffer 440_3 may be provided to a third column of memory blocks 410_12, 410_23, and 410_33, and a fourth transfer buffer 440_4 may be provided to a fourth column of memory blocks 410_14, 410_24, and 410_34. Similar to memory blocks, row data link 451_4 extends between two adjacent transfer buffers 440_1 and 4402 and two column data links 452_1 and 452_2 extend to the row data link 451_4 between the first column of memory blocks and the second column of memory blocks. In some embodiments, transfer buffer 440 may only have a row buffer to store data in a row of memory cells. When data needs to be transferred from first memory block 410_11 in a first column to third memory block 410_13 in a third column, selector 430_1 may select the first switch 420_1 to turn on and selector 430_2 may select eighth switch 420_8 to turn on in a first cycle. In the first cycle, data from the first memory block 410_11 can be stored in a row buffer of second transfer buffer 440_2. In a second cycle, selector 430_3 may select $15^{th}$ switch 420_15 to turn on and selector 430_4 may select $10^{th}$ switch 420_10 to turn on and then the data stored in the second transfer buffer 440_2 cam be transferred to the third memory block 410_13.

While FIG. 4 illustrates first transfer buffer 440_1 and fourth transfer buffer 440_4 and $7^{th}$ switch 420_7 and $24^{th}$ switch 420_24, those elements may be omitted in some embodiments in that the first transfer buffer 440_1 does not provide data to be transferred and the fourth transfer buffer 440_4 does not become a final destination for data transfer. According to embodiments of the present disclosure, via transfer buffer 440, data transfer between non-neighboring memory blocks can be performed without using global buffer 340, which also improves data transfer performance between non-neighboring memory blocks as well as overall throughput in executing neural network models on PIM accelerator 210. According to some embodiments of the present disclosure, data transfer between non-neighboring memory blocks may take H cycles, where H is the column difference between two non-neighboring memory blocks. For example, when data is transferred from first memory block 410_11 in a first column and to third memory block 410_13 in a third column, data transfer may take 2 cycles (e.g., $1^{st}$ cycle from first memory block 410_11 to second transfer buffer 440_2 and $2^{nd}$ cycle from second transfer buffer 440_2 to third memory block 410_13). When the data needs C cycles for each transfer from first memory block 410_11 to second transfer buffer 440_2 and from second transfer buffer 440_2 to third memory block 410_13 due to data size, the data transfer may take H*C cycles in total.

In some embodiments, data can be transferred in one direction in memory block assembly 310 through row and column data links 451 and 452 or transfer buffer 440. For example, in memory block assembly 310 of FIG. 4, data can be transferred from a left side to a right side (i.e., a direction from a first column to a second column) in FIG. 4 in memory block assembly 310 through row and column data links 451 and 452 or transfer buffer 440. When data needs to be transferred in other directions such as a direction from a right side to a left side or a direction parallel to a column direction, such data transfer can be performed via global buffer 340. For example, when moving data from one memory block (e.g., 410_11) to another memory block (410_21) located in a same column with the one memory block, controller 320 may be configured to perform data transfer via global buffer 340. When moving data from one memory block (e.g., 410_12) to another memory block (e.g., 410_11), controller 320 may be configured to perform such data transfer via global buffer 340. While embodiments in which data is transferred from a left side to a right side in memory block assembly 310 of FIG. 4 have been explained, it is appreciated that embodiments of the present disclosure can be implemented such that data can be transferred in any other direction.

According to embodiments of the present disclosure, a neural network model can be mapped to multiple memory blocks 410 and the memory blocks can process corresponding tasks such as training or inference in a pipelined manner to maximize system throughput. In some embodiments, memory tile 300 of FIG. 3 may include an instruction storage 350 configured to store instructions for executing a neural network model in memory block assembly 310 in a pipelined manner. Instruction storage 350 may store instructions of computations or data movements between memory blocks in memory block assembly 310. Controller 320 can be configured to access instruction storage 350 to retrieve the instructions stored in the instruction storage 350.

Instruction storage 35 may be configured to have a separate instruction segment assigned to each memory block. In some embodiments, an instruction segment assigned, to corresponding memory block 410 can be divided into multiple sections, for example, three sections including RECEIVE section, COMPUTE section, and SEND section. RECEIVE section can store instructions of loading data for processing tasks assigned to corresponding memory block 410. Data may be transferred from other memory blocks 410, transfer buffer 440, global buffer 340, or host unit 220. For example, instructions regarding which source location the data is transferred from can be stored in RECEIVE section. COMPUTE section can store instructions for performing computation related operations of a neural network model. For example, instructions regarding which computational operation is performed can be stored in COMPUTE section. SEND section can store instructions of transferring output data to other memory blocks 410, transfer buffer 440, global buffer 340, or host unit 220. For example, instructions regarding which destination location the output data is transferred to can be stored in SEND section. In some embodiments, compiler can determine operands' source and destination addresses of corresponding instructions based on the memory layout in memory block assembly 310 and data layout mechanism.

Figure 5A:
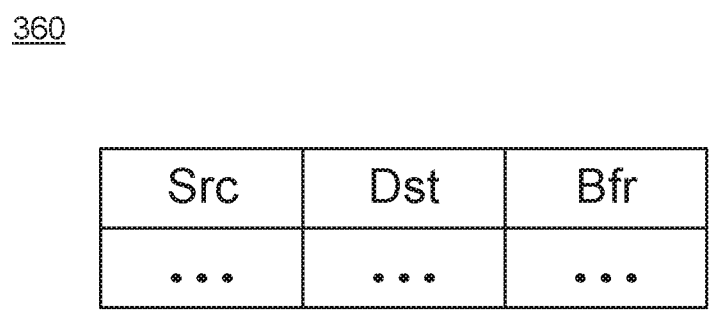

According to embodiments of the present disclosure, memory tile 300 can further include one or more control tables. In some embodiments, memory tile 300 can include a data transfer table for recording data transfer in memory tile 300. FIG. 5A illustrates an exemplary data transfer table 360 for recording data transfer in memory tile 300, consistent with embodiments of the present disclosure. Data transfer table 360 can be configured to record data transfers between memory blocks. In some embodiments, data transfer table 360 may be configured to record pending data transfers. As shown in FIG. 5A, data transfer table 360 can have a plurality of fields, for example, including a source field (Src), a destination field (Dst), and a buffer field (Bfr). Source field may include information indicating a memory block that sends data and destination field may include information indicating a memory block that receives the data. Buffer field may include information indicating which buffer (e.g., transfer buffer 440 or global buffer 340) the data is currently placed in. Controller 320 can schedule instructions during run time for executing a neural network model referring to information stored in data transfer table 360. According to some embodiments of the present disclosure, memory block 410 can perform one of computation or data transfer at a time and data size transferrable at one cycle is limited, one data transfer may take multiple cycles to be completed.

Figure 5B:
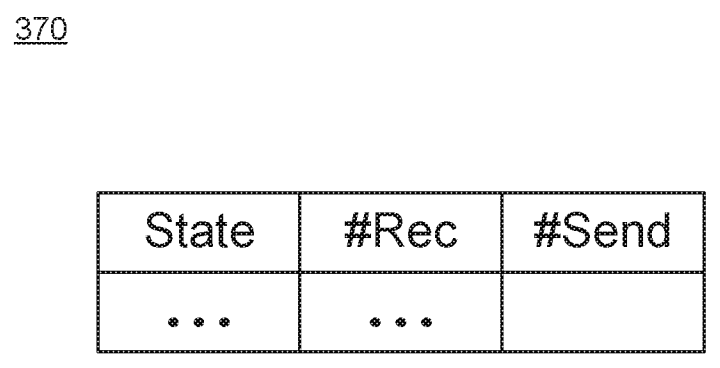
Figure 5C:
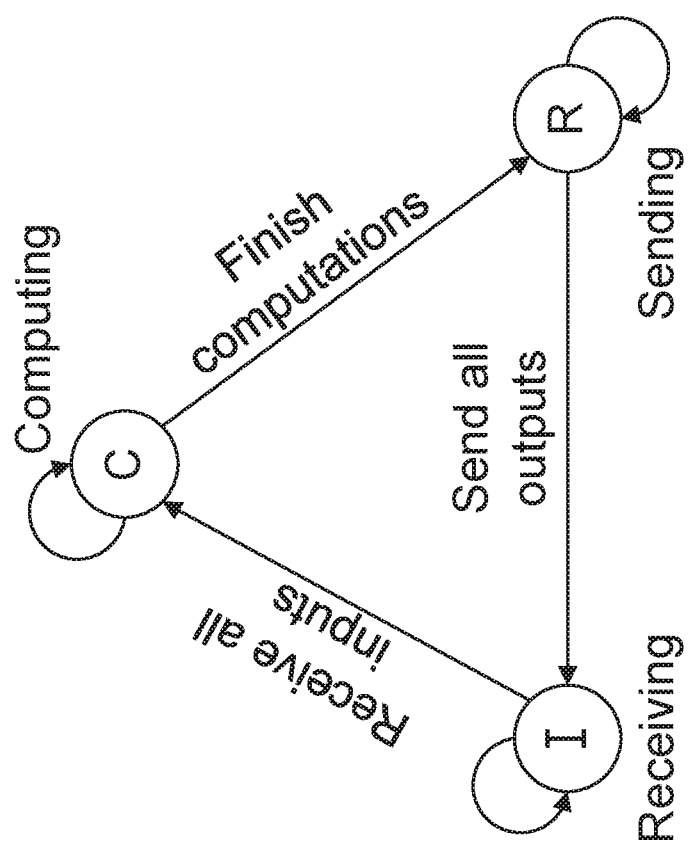
FIG. 5C illustrates an exemplary status transition cycle for a memory block, consistent with embodiments of the present disclosure.

In some embodiments, memory tile 300 can include a block table for indicating which status the corresponding memory block is in. FIG. 5B illustrates an exemplary block table 370 for recording a memory block status, consistent with embodiments of the present disclosure. As shown in FIG. 5B, block table 370 can have a state field (State) storing a current status of the corresponding memory block. According to some embodiments of the present disclosure, during execution of a neural network model, memory block 410 can have one of statuses, for example, including idle status (I), computing status (C), and ready status (R). Referring to FIG. 5C illustrating an exemplary status transition cycle for memory block 410, memory block's statuses will be explained. As shown in FIG. 5C, once memory block 410 receives all data for executing a certain computational operation, status of the memory block 410 changes from idle status (I) to computing status (C). Once memory block 410 completes the computational operations, status of the memory block 410 changes from computing status (C) to ready status (R). Once memory block 410 completes sending output data to a destination location, status of the memory block 410 changes from ready status (R) to idle status (I).

The status transition cycle can be repeated during execution of neural network models according to some embodiments of the present disclosure. In some embodiments, data transfers may be suspended when a destination memory is full. For example, when data is transferred to transfer buffer 440 and the transfer buffer 440 is full or lacks space for additional data transfer, the scheduled data transfer can be suspended until the transfer buffer 440 is emptied. In some embodiments, block table 370 of FIG. 5B may include fields recording a size of received data or a size of transferring data. In some embodiments, the size of received data can be recorded by counting an iteration number of transferring data. For example, when a data size transferable in one cycle is fixed or limited and data to be transferred is bigger than the data size transferable in one cycle, the data to be transferred can be divided into smaller portions each of which has equal to or smaller than the data size transferable in one cycle. Then, the divided smaller portions can be transferred from one location to another location during multiple cycles. Therefore, in some embodiments, counting an iteration number of transferring data can be used to determine the size of data transferred. As shown in FIG. 5B, block table 370 may have a field (#Rec) recording an iteration number of receiving data and a field (#Send) recording an iteration number of sending data.

Referring back to FIG. 3, controller 320 can be configured to schedule instructions (e.g., stored in memory storage 350) by coordinating hardware components in memory block assembly 310 for pipelined execution of a neural network model. According to some embodiments of the present disclosure, controller 320 can be configured to decode instructions, schedule instructions, and update control tables (e.g., data transfer table 360 and block table 370). During run time, controller 320 may periodically check control tables (e.g., data transfer table 360 or block table 370) to determine a next step for each memory block 410. For example, controller 320 can determine which status (e.g., idle status (I), computing status (C), or ready status (R)) memory block 410 will enter into in a next cycle by referring to data transfer table 360 or block table 370. After checking the next step, controller 320 may schedule instructions corresponding to the next step of memory block 410 by referring to instruction storage 350. Controller 320 may be configured to update data transfer table 360 or block table 370 according to the scheduling. According to some embodiments of the present disclosure, controller 320 may be configured to manage data communication using global buffer 340. In some embodiments, controller 320 may be configured to manage data communication to/from host unit 220 or host memory 221.

As explained above, controller 320 can schedule computations for memory blocks 410 in memory block assembly 310 and data transfers in memory block assembly 310, e.g., based on information stored in instruction storage 350, data transfer table 360, or block table 370. According to embodiments of the present disclosure, controller 320 can schedule computations and data transfers for memory blocks in memory block assembly 310 in order to execute a neural network model in a pipelined manner. A below example for executing a neural network model on memory tile 300 of FIG. 3 in a pipelined manner will be explained referring to FIG. 6A to FIG. 6C.

Figure 6A:
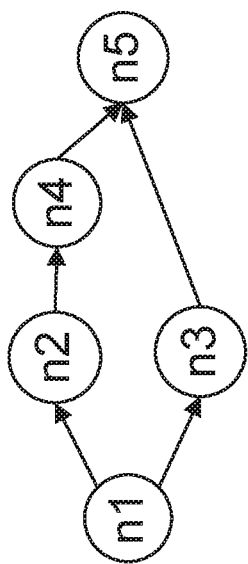
FIG. 6A illustrates an example of a neural network model, consistent with embodiments of the present disclosure.

FIG. 6A illustrates an example of a neural network model, consistent with embodiments of the present disclosure. In machine learning or deep learning, a neural network model may be graphically represented by a computational graph or a data structure comprising nodes and edges organized as a directed acyclic graph (DAG). Nodes represent variables or computation operations, while edges represent data or tensor flow from one node to another. A node representing a computation operation can consume input data flowing in along an incoming edge to the node, while output data produced by the computation operation can flow out along an outgoing edge from the node. A typical machine-learning or deep-learning model may have thousands or even millions of variables and computation operations.

As shown in FIG. 6A, a computation graph includes a plurality of nodes n1 to n5 and edges connecting two nodes among the plurality of nodes n1 to n5. The computation graph shown in FIG. 6A can be a part of a certain neural network model. It should be noted that the computation graph of FIG. 6A is explanatory only and not restrictive, and thus embodiments of the present disclosure can be applied to a computation graph having any number of nodes and edges. A second node n2 and a third node n3 receive output data of a first node n1. Output data of second node n2 is provided to a fourth node n4 as input data. Output data of fourth node n4 is provided to a fifth node n5 as input data. Output data of third node n3 is provided to fifth node n5 as input data. In some embodiments, nodes n1 to n5 can represent corresponding computational operations. Edges can represent dependency between two nodes connected by the corresponding edge. That is, a node at the end point of the edge can be processed only after a process of a node at the start point of the edge is completed. For example, fifth node n5 can be processed only after third node n3 and fourth node n4 are processed and the output data of third and fourth nodes n3 and n4 are provided to fifth node n5.

According to embodiments of the present disclosure, computation graph of FIG. 6A may be considered as having four computational layers based on data dependency among nodes n1 to n5. For example, first node n1 can constitute a first layer, second and third nodes n2 and n3 can constitute a second layer because second and third nodes n2 and n3 receive output data of first node n1. Similarly, fourth node n4 can constitute a third layer and fifth node n5 can constitute a fourth layer. In some embodiments, second node n2 can constitute a second layer and third and fourth nodes n3 and n4 can constitute a third layer.

Figure 6B:
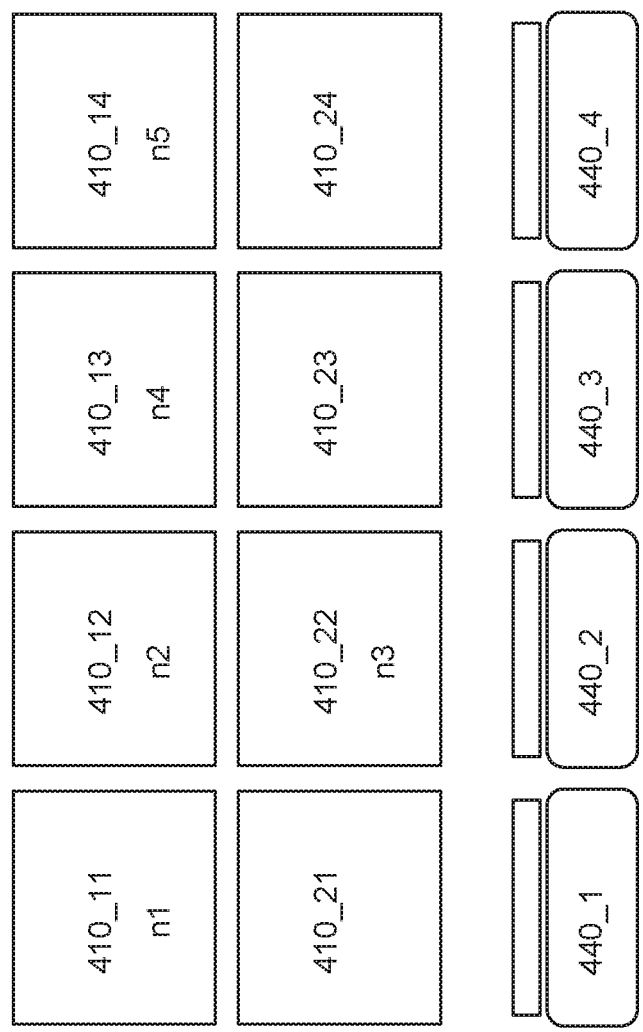
FIG. 6B illustrates an exemplary node mapping for executing a neural network model of FIG. 6A in memory block assembly, consistent with embodiments of the present disclosure.

FIG. 6B illustrates an example of node mapping for executing a neural network model of FIG. 6A in memory block assembly 310, consistent with embodiments of the present disclosure. FIG. 6B illustrates a part of memory block assembly 310 shown in FIG. 4 including eight memory blocks 410_11 to 410_24 arranged in two rows and four columns and four transfer buffers 440_1 to 440_4. In FIG. 6B, the rest of memory blocks and datalinks are omitted for simplicity. As explained with respect to FIG. 4, data can be transferred in one direction in memory block assembly 310, e.g., left to right direction.

In this example, computation graph of FIG. 6A is mapped on memory blocks in memory block assembly 310 in FIG. 6B by considering data movements between memory blocks and node dependency. As shown in FIG. 6B, first node n1 can be assigned to first memory block 410_11 in a first column, which is the leftmost column in memory block assembly 310, because first node n1 does not receive data from other memory blocks assigned to nodes n2 to n5. Second node n2 and third node n3 are assigned to second memory block 410_12 and sixth memory block 410_22 in a second column because second node n2 and third node n3 receive output data from first node n2, which is assigned to first memory block 410_11 in the first column. Similarly, fourth node n4 and fifth node n5 are assigned to third memory block 410_13 and fourth memory block 410_14 in a third column and fourth column respectively.

Figure 6C:
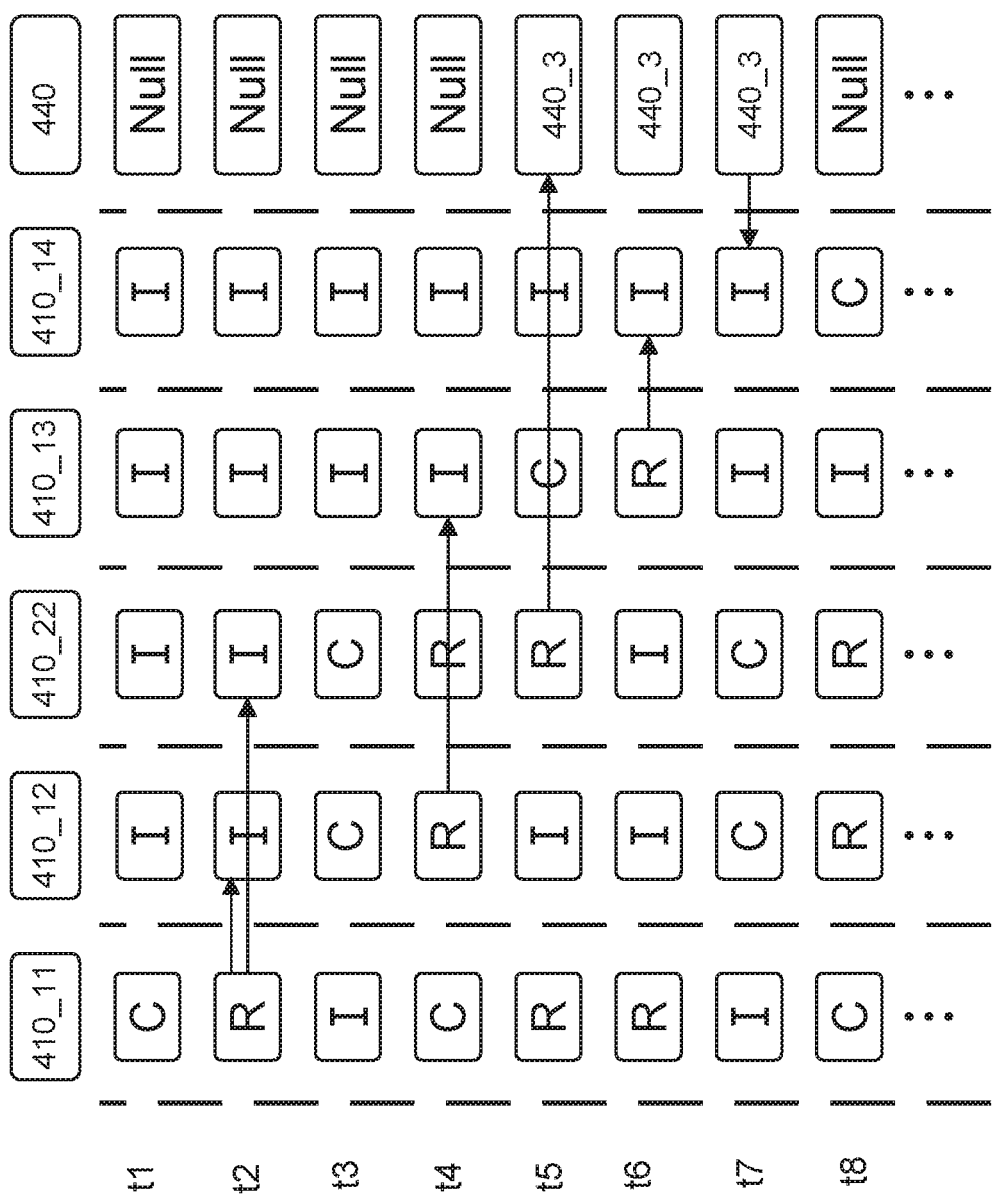
FIG. 6C illustrates status transitions of memory blocks during execution of a neural network model of FIG. 6A in memory block assembly, consistent with embodiments of the present disclosure.

FIG. 6C illustrates status transitions of memory blocks during execution of a neural network model of FIG. 6A in memory block assembly 310, consistent with embodiments of the present disclosure. Block memory's status is updated into block table 370 periodically during run time of processing a neural network model. According to some embodiments of the present disclosure, controller 320 checks block table 370 and adds information from memory block 410 having ready status R to data transfer table 360. The information added to data transfer table 360 can include a source location and a destination location of data to be transferred and buffer information that can be used for transferring the data. According to embodiments of the present disclosure, controller 320 can schedule pipelined processing of a neural network model in memory block assembly 310 by using data transfer table 360 and block table 370, which can maximize memory utilization and improve overall throughput of the system.

FIG. 6C illustrates status changes of memory blocks and transfer buffers during run time for executing a computation graph of FIG. 6A in a pipelined manner as an example. As shown in FIG. 6C, during a first time period t1, first memory block 410_11 performs its assigned computation (it is assumed that data for processing assigned computation is all retrieved), e.g., computation of first node n1 and status for first memory block 410_11 for first time period t1 can be represented as computing status C. Because computations of all other nodes n2 to n5 cannot be processed until output data of first node n1 is provided to corresponding memory blocks such as 410_12 and 410_22, statuses for other memory blocks 410_12, 410_22, 410_13, and 410_14 are represented as idle status I during first time period t1.

After first memory block 410_11 completes its computation of first node n1, as shown in second time period t2 in FIG. 6A, status for first memory block 410_11 can change to ready status R, which indicates that data is ready for transfer. In second time period t2, other memory blocks 410_12, 410_22, 410_13, and 410_14 remain in idle status I. During second time period t2, output data generated from first memory block 410_11 can be transferred to second memory block 410_12 and sixth memory block 410_22 assigned to second node n2 and third node n3, respectively. In some embodiments, controller 320 may update data transfer table 360 for recording the pending data transfer of second time period t2. In FIG. 6A, arrows are used to indicate data transfer from the starting point of the arrow to the ending point of the arrow. Because output data is transferred to two memory blocks 410_12 and 410_22 in the adjacent column (e.g., second column) to the first memory block 410_11, the output data can be transferred using datalinks (e.g., row data links 451_1 and 451_2 and column data links 452_1 and 452_2 of FIG. 4) and turning on switches (e.g., first switch 420_1, second switch 420_2, and fourth switch 420_4 of FIG. 4) without using transfer buffer 440 or global buffer 340. In some embodiments, after data transfer between first memory block 410_11 and second memory block 410_12 is completed, data transfer between first memory block 410_11 and sixth memory block 410_22 can be performed. In some other embodiments, data transfer between first memory block 410_11 and second memory block 410_12 and data transfer between first memory block 410_11 and sixth memory block 410_22 can be performed at the same time.

After data transfer from first memory block 410_11 to second memory block 410_12 and sixth memory block 410_22 is completed, second memory block 410_12 and sixth memory block 410_22 can start processing assigned computations of second node n2 and third node n3 using the data received from first memory block 410_11. In some embodiments, controller 320 may also update data transfer table 360 to remove the entry for data transfer from first memory block 410_11 to second memory block 410_12 and sixth memory block 410_22 once the corresponding transfers are completed. During third time period t3, second memory block 410_12 and sixth memory block 410_22 can have computing status C and the rest of memory blocks have idle status I. In some embodiments, first memory block 410_11 can receive input data for processing assigned computations at a subsequent cycle while the first memory block 410_11 is in idle status I during third time period t3.

After second memory block 410_12 and sixth memory block 410_22 complete their assigned computations of second node n2 and third node n3, as shown in fourth time period t4 in FIG. 6A, statuses for second memory block 410_12 and sixth memory block 410_22 can change to ready status R. In fourth time period t4, third memory block and fourth memory block 410_13 and 410_14 remain in idle status I. During fourth time period t4, output data generated from second memory block 410_12 can be transferred to third memory block 410_13 as indicated by an arrow.

According to embodiments of the present disclosure, output data generated from sixth memory block 410_22 is not transferred at the same time when the output data generated from second memory block 410_12 is transferred to third memory block 410_13 because these two data transfers use same data links between a second column of memory blocks and a third column of memory blocks while output data generated from sixth memory block 41022 is different from the output data generated from second memory block 410_12. In this example, after data transfer between second memory block 410_12 and third memory block 410_13 is completed, data transfer between sixth memory block 410_22 and fourth memory block 410_14 can get started (during fifth time period t5). In some other embodiments, after data transfer between sixth memory block 41022 and fourth memory block 410_14 is completed, data transfer between second memory block 410_12 and third memory block 410_13 can be performed. In the meantime, first memory block 410_11 can perform its assigned computation during fourth time period t4.

During fifth time period t5, third memory block 410_13 can process its assigned computation of fourth node n4 using data received from second memory block 410_12. Data transfer between sixth memory block 410_22 and fourth memory block 410_14 can get started during fifth time period t5. Because sixth memory block 410_22 and fourth memory block 410_14 are not placed adjacent to each other, data transfer between them can be performed by using transfer buffer 440. During fifth time period t5, output data generated from sixth memory block 410_22 can be transferred to third transfer buffer 440_3 using data links (e.g., row data links 451 and column data links 452 between second column and third column of memory blocks of FIG. 4) and turning on switches (e.g., 11$^{th}$ switch 420_11 and 16$^{th}$ switch 420_16 of FIG. 4). FIG. 6C shows in the last column that third transfer buffer 440_3 is being used in fifth time period t5. In the meantime, second memory block and fourth memory block 410_12 and 410_14 can be in idle status I and first memory block 410_11 can be in ready status R. During fifth time period t5, output data generated during fourth time period t4 in first memory block 410_11 can be transferred to second memory block 410_12, which is not indicated in FIG. 6C for simplicity.

After third memory block 410_13 completes its computation, third memory block 410_13 can enter ready status R in sixth time period t6. During sixth time period t6, second memory block 410_12, sixth memory block 410_22, and fourth memory block 410_14 can be in idle status I. During sixth time period t6, output data from third memory block 410_13 can be transferred to fourth memory block 410_14 using data links (e.g., between third column and fourth column of memory blocks of FIG. 4) without using transfer buffer 440, which is represented as an arrow in FIG. 6C. During sixth time period t6, output data generated during fourth time period t4 in first memory block 410_11 can be also transferred to sixth memory block 410_22 because the data transfer between first memory block 410-11 and sixth memory block 410_22 can be performed using different data links (e.g., between first column and second column of memory blocks in FIG. 4) from the data transfer between third memory block 410_13 and fourth memory block 410_14. According to embodiments of the present disclosure, output data generated during fourth time period t4 in first memory block 410_11 cannot be transferred to sixth memory block 410_22 during fifth time period t5 because sixth memory block 410_22 is sending its output data to other destination in that memory block 410 can perform either of computation or data transfer at a time.

Status of third memory block 410_13 changes to idle status I after data transfer is completed as shown in seventh time period t7 of FIG. 6C. During seventh time period t7, fourth memory block 410_14 remains in idle status I and cannot start processing its assigned computation because the fourth memory block 410_14 has not received output data generated from sixth memory block 410_22 yet. During seventh time period t7, data stored in third transfer buffer 440_3, which has been transferred from sixth memory block 410_22 during fifth time period t5, is transferred to fourth memory block 410_14. In the meantime, second memory block 410_12 and sixth memory block 410_22 can perform their assigned computations because second memory block 410_12 and sixth memory block 410_22 have received data from first memory block 410_11 during fifth and sixth time periods t5 and t6 respectively. In some embodiments, first memory block 410_11 can be in idle status I and receive input data to be used in a next cycle.

In eighth time period t8, fourth memory block 410_14 can perform its assigned computation of fifth node n5 because fourth memory block 410_14 has received both inputs from sixth memory block 410_22 during sixth time period t6 and third memory block 410_13 during fifth time period t5 and seventh time period t7. Similar to the fourth time period t4, in eighth time period t8, second memory block 410_12 and sixth memory block 410_22 can be in ready status R and third memory block 410_13 can be in idle status I. During eighth time period t8, output data generated from second memory block 410_12 can be transferred to third memory block 410_13. First memory block 410_11 can perform its assigned computation during eighth time period t8.

It will be appreciated that time periods t1 to t8 of FIG. 6C can have different time length depending on processing times for computations, data sizes to be transferred, data size transferrable at one cycle, etc. For example, second time period t2 can correspond to multiple cycles of sending operations if data to be transferred is bigger than a data size transferrable at one cycle. Similarly, processing times for different computations can be different and therefore first time period t1 for processing first node n1's computation can be different from third time periods t3 for processing second node n2's computation and third node n3's computation. As illustrated in FIG. 6A to FIG. 6C, a neural network model can be efficiently executed in pipelined manner in memory tile 300 based on memory block assembly 310 layout and control tables (e.g., data transfer table 360 and block table 370). According to embodiments of the present disclosure, memory utilization of memory tile 300 can be maximized and overall system efficiency can be also improved.

Figure 7:
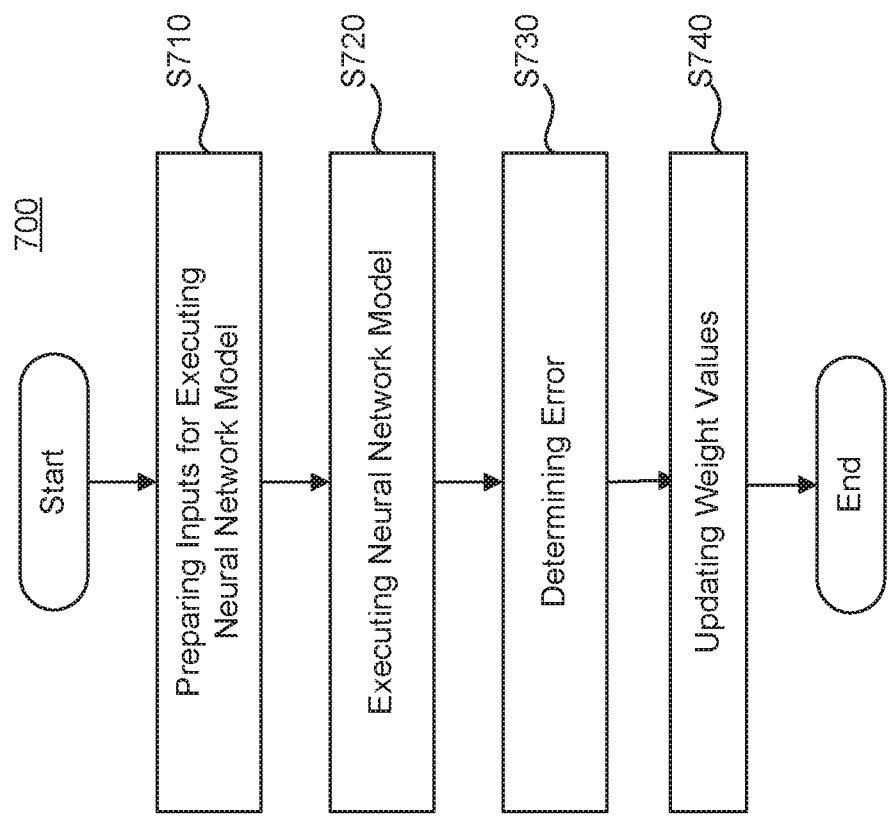
FIG. 7 illustrates an exemplary flow diagram for training a neural network model on a neural network accelerator architecture of FIG. 2A, consistent with embodiments of the present disclosure.

FIG. 7 illustrates an exemplary flow diagram for training a neural network model on a neural network accelerator architecture of FIG. 2A, consistent with embodiments of the present disclosure. Neural network accelerator architecture (e.g., neural network accelerator architecture 200 in FIG. 2A) can be used for training a neural network model according to some embodiments of the present disclosure.

At step S710, input data for executing a neural network model can be prepared. In some embodiments, host unit (e.g., host unit 220 of FIG. 2A) can offload input data to memory tile (e.g., memory tile 300 of FIG. 3). In some embodiments, host unit can offload input data for a neural network model in a batch to multiple memory tiles via interface (e.g., interface 212 of FIG. 2A). In some embodiments, host unit can prepare different weight values for each of one or more memory tiles.

At step S720, one or more memory tiles can execute a neural network model based on the received input data, consistent with embodiments of the present disclosure. In some embodiments, one or more memory tiles (e.g., memory tile 300 of FIG. 3) can execute a neural network model concurrently based on a different set of weight values. In some embodiments, each memory tile can execute the neural network model in a feed forward process.

At step S730, after execution of the neural network model is completed, execution results from one or more memory tiles can be collected. In some embodiments, execution results can be sent to host unit via interface (e.g., interface 212 of FIG. 2A) and host unit can determine output errors for each execution result. In some embodiments, host unit can have information of correct execution result for the corresponding neural network model. Host unit may determine average error of the execution results from one or more memory tiles.

At step S740, weight values for a neural network model can be updated based on the determined error at step S730. According to embodiments of the present disclosure, the determined error can be an average error for execution results from one or more memory tiles. In some embodiments, host unit may send the average error to one or more memory tiles. One or more memory tiles can execute the neural network model in a back-propagation manner to determine weight values according to the average error.

In some embodiments, steps of FIG. 7 for training a neural network model can be repeated until a certain condition is met. For example, a condition for finishing the training process of FIG. 7 can be that the average error determined at step S730 is smaller than a threshold value. In some embodiments, a condition for finishing the training of FIG. 7 can be that iteration number of steps of FIG. 7 is bigger than a threshold value. According to embodiments of the present disclosure, multiple memory tiles can be used for training a neural network model and training accuracy can be improved.

According to embodiments of the present disclosure, a neural network accelerator architecture can be used for inference processes. In some embodiments, host unit can send a same set of weights to multiple tiles and multiple tiles can perform inference processes based on the same set of weights with different input values in parallel. By using multiple tiles for the same neural network model, inference throughput can be improved according to embodiments of the present disclosure.

Embodiments of the present disclosure can provide a data layout conscious PIM architecture, which enables flexible data layout transformation and supports efficient data movement patterns for executing neural network models. Embodiments of the present disclosure enable efficient data transfer between memory blocks via memory tile design with interconnected memory blocks arranged in a 2D-mesh topology and data links and switches. Embodiments of the present disclosure also enable computations and data transfers in a pipelined manner via transfer buffers and control tables. According to embodiments of the present disclosure, data layout across memory blocks can be obtained and therefore neural network model can be mapped to PIM accelerator architecture with flexibility, which boost memory utilization and parallel computation.

The embodiments may further be described using the following clauses:

1. A processing in memory (PIM) enabled device for executing a neural network model, comprising:
    a memory block assembly comprising:
        a first array of memory blocks;
        a second array of memory blocks adjacent to the first array of memory blocks;
        a plurality of first data links associated with the first array of memory blocks and the second array of memory blocks, wherein each data link of the plurality of first data links communicatively couples two corresponding memory blocks of which are from the first array of memory blocks and the second array of memory blocks respectively; and
        a second data link communicatively coupled to the plurality of first data links,
        wherein data from a first memory block of the first array of memory blocks is transferable to a second memory block of the second array of memory blocks via the plurality of first data links and the second data link.
2. The PIM enabled device of clause 1, wherein the memory block assembly further comprises:
    a first switch configured to control opening or closing a data path from the first memory block to a first data link communicatively coupled with the first memory block among the plurality of first data links; and
    a second switch configured to control opening or closing a data path from a first data link communicatively coupled with the second memory block among the plurality of first data links to the second memory block.
3. The PIM enabled device of clause 2, wherein the memory block assembly further comprises:
    a first selector configured to select the first switch to open the data path from the first memory block to the first data link communicatively coupled with the first memory block; and
    a second selector configured to select the second switch to open the data path from the first data link communicatively coupled with the second memory block to the second memory block.
4. The PIM enabled device of any one of clauses 1 to 3, wherein each memory block includes a memory cell array arranged in a plurality of rows and in a plurality of columns.
5. The PIM enabled device of any one of clauses 1-4, wherein the plurality of first data links and the second data link are configured to transfer the data stored in a column of memory cells in the first memory block to a row of memory cells in the second memory block in one cycle.
6. The PIM enabled device of clause 1, wherein the memory block assembly further comprises:
    a third array of memory blocks adjacent to the second array of memory blocks;
    a plurality of third data links associated with the second array of memory blocks and the third array of memory blocks, wherein each of data link of the plurality of third data links communicatively couples two corresponding memory blocks of which are from the second array of memory blocks and the third array of memory blocks respectively;
    a fourth data link communicatively coupled to the plurality of third data links; and
    a transfer buffer communicatively coupled with the second data link and the fourth data link,
    wherein data from the first memory block of the first array of memory blocks is transferable to a third memory block of the third array of memory blocks via the transfer buffer.
7. The PIM enabled device of clause 6, wherein the memory block assembly further comprises:
    a first buffer data link configured to communicatively couple the second data link and the transfer buffer; and
    a second buffer data link configured to communicatively couple the fourth data link and the transfer buffer.
8. The PIM enabled device of clause 7, wherein the memory block assembly further comprises:
    a first switch configured to control opening or closing a data path from the first memory block to a first data link communicatively coupled with the first memory block among the plurality of first data links;
    a second switch configured to control opening or closing a data path from the first buffer data link to the transfer buffer;
    a third switch configured to control opening or closing a data path from the transfer buffer to the second buffer data link; and
    a fourth switch configured to control opening or closing a data path from a third data link communicatively coupled with the third memory block among the plurality of third data links to the third memory block.
9. The PIM enabled device of clause 8, wherein the memory block assembly further comprises:
    a first selector configured to select the first switch to open the data path from the first memory block to the first data link communicatively coupled with the first memory block;
    a second selector configured to select the second switch to open the data path from the first buffer data link to the transfer buffer;
    a third selector configured to select the third switch to open the data path from the transfer buffer to the second buffer data link and
    a fourth selector configured to select the fourth switch to open the data path from the third data link communicatively coupled with the third memory block to the third memory block.
10. The PIM enabled device of any one of clauses 6-9, wherein each memory block includes a memory cell array arranged in a plurality of rows and in a plurality of columns.
11. The PIM enabled device of any one of clauses 6-10, wherein the plurality of first data links, the second data link, and the first buffer data link are configured to transfer the data stored in a column of memory cells in the first memory block to a row of memory cells in the transfer buffer in one cycle.
12. The PIM enabled device of clause 11, wherein the second buffer data link, the fourth data link, and the plurality of third data links are configured to transfer the data stored in the row of memory cells in the transfer buffer to a row of memory cells in the third memory block in another cycle.
13. The PIM enabled device of any one of clauses 1-12, further comprising a block table for recording a status for each memory block in the memory block assembly, wherein the status includes computing status indicating a corresponding memory block is executing an assigned operation, ready status indicating a corresponding memory block has data ready for being transferred, and an idle status indicating a corresponding memory is ready for receiving data.

14. The PIM enabled device of any one of clauses 1-13, further comprising a data transfer table for recording pending data transfer in the memory block assembly, wherein the data transfer table includes a source field indicating a memory block sending data and a destination field indicating a memory block receiving the data.
15. The PIM enabled device of clause 14, wherein the data transfer table further includes a buffer field indicating a buffer the data resides in.
16. The PIM enabled device of any one of clauses 1-15, further comprising a controller configured to provide commands to the memory block assembly to execute a first operation of the neural network model on the first memory block and a second operation of the neural network model on the second memory block, the second operation uses output data from execution of the first operation as an input.
17. A method for executing a neural network model on a processing in memory (PIM) enabled device comprising a memory block assembly, comprising:
processing a first operation of the neural network model on a first memory block of a first array of memory blocks in the memory block assembly;
transferring output data from the first memory block to a second memory block of a second array of memory blocks in the memory block assembly via data links communicatively coupling the first memory block and the second memory in the memory block assembly; and
processing, on the second memory block, a second operation of the neural network model based on the output data.
18. The method of clause 17, further comprising:
transferring the output data from the first memory block to a third memory block of the second array of memory blocks; and
processing, on the third memory block, a third operation of the neural network model based on the output data,
wherein transferring the output data from the first memory block to the third memory block is performed after or during a time period of transferring the output data from the first memory block to the second memory block.
19. The method of clause 17, wherein transferring output data comprises:
transferring the output data from the first memory block to a transfer buffer in the memory block assembly; and
transferring the output data from the transfer buffer to the second memory block,
wherein the transfer buffer is communicatively coupled with the first memory block and the second memory block.
20. The method of any one of clauses 17-19, wherein transferring output data comprises:
transferring the output data stored in a column of memory cells in the first memory block to a row of memory cells in the second memory block.
21. The method of any one of clauses 17-20, wherein transferring output data is performed in one or more cycles depending on a size of the output data.
22. The method of any one of clauses 17-21, further comprising:
recording a status for each memory block in the memory block assembly in a block table,
wherein the status includes a computing status indicating a corresponding memory block is executing an assigned operation, a ready status indicating a corresponding memory block has data ready for being transferred, and an idle status indicating a corresponding memory is ready for receiving data.
23. The method of any one of clauses 17-22, further comprising:
recording pending data transfer in the memory block assembly in a data transfer table,
wherein the data transfer table includes a source field indicating a memory block sending data and a destination field indicating a memory block receiving the data.
24. A non-transitory computer readable storage media storing a set of instructions that are executable by at least one processor of a processing in memory (PIM) enabled terminal to cause the terminal to perform a method comprising:
processing a first operation of the neural network model on a first memory block of a first array of memory blocks in a memory block assembly;
transferring output data from the first memory block to a second memory block of a second array of memory blocks in the memory block assembly via data links communicatively coupling the first memory block and the second memory in the memory block assembly; and
processing, on the second memory block, a second operation of the neural network model based on the output data.
25. The computer readable medium of clause 24, wherein the set of instructions that is executable by at least one processor of the terminal to cause the terminal to further perform:
transferring the output data from the first memory block to a third memory block of the second array of memory blocks; and
processing, on the third memory block, a third operation of the neural network model based on the output data,
wherein transferring the output data from the first memory block to the third memory block is performed after or during a time period of transferring the output data from the first memory block to the second memory block.
26. The computer readable medium of clause 24, wherein the set of instructions that is executable by at least one processor of the terminal to cause the terminal to further perform:
transferring the output data from the first memory block to a transfer buffer in the memory block assembly; and
transferring the output data from the transfer buffer to the second memory block,
wherein the transfer buffer is communicatively coupled with the first memory block and the second memory block.
27. The computer readable medium of any one of clauses 24-26, wherein transferring output data comprises:
transferring the output data stored in a column of memory cells in the first memory block to a row of memory cells in the second memory block.
28. The computer readable medium of any one of clauses 24-27, wherein transferring output data is performed in one or more cycles depending on a size of the output data.
29. The computer readable medium of any one of clauses 24-28, wherein the set of instructions that is executable by at least one processor of the terminal to cause the terminal to further perform:
recording a status for each memory block in the memory block assembly in a block table, wherein the status includes a computing status indicating a corresponding memory block is executing an assigned operation, a ready status indicating a corresponding memory block has data ready for being transferred, and an idle status indicating a corresponding memory is ready for receiving data.

30. The computer readable medium of any one of clauses 24-29, wherein the set of instructions that is executable by at least one processor of the terminal to cause the terminal to further perform:
recording pending data transfer in the memory block assembly in a data transfer table,
wherein the data transfer table includes a source field indicating a memory block sending data and a destination field indicating a memory block receiving the data.

31. A terminal, comprising:
a host unit; and
a processing in memory (PIM) enabled device communicatively coupled to the host unit, the PIM enabled device comprising:
 a memory block assembly comprising:
  a first array of memory blocks;
  a second array of memory blocks adjacent to the first array of memory blocks;
  a plurality of first data links associated with the first array of memory blocks and the second array of memory blocks, wherein each data link of the plurality of first data links communicatively couples two corresponding memory blocks of which are from the first array of memory blocks and the second array of memory blocks respectively; and
  a second data link communicatively coupled to the plurality of first data links,
  wherein data from a first memory block of the first array of memory blocks is transferable to a second memory block of the second array of memory blocks via the plurality of first data links and the second data link.

Embodiments herein include database systems, methods, and tangible non-transitory computer-readable media. The methods may be executed, for example, by at least one processor that receives instructions from a tangible non-transitory computer-readable storage medium. Similarly, systems consistent with the present disclosure may include at least one processor and memory, and the memory may be a tangible non-transitory computer-readable storage medium. As used herein, a tangible non-transitory computer-readable storage medium refers to any type of physical memory on which information or data readable by at least one processor may be stored. Examples include random access memory (RAM), read-only memory (ROM), volatile memory, non-volatile memory, hard drives, CD ROMs, DVDs, flash drives, disks, registers, caches, and any other known physical storage medium. Singular terms, such as "memory" and "computer-readable storage medium," may additionally refer to multiple structures, such a plurality of memories or computer-readable storage media. As referred to herein, a "memory" may comprise any type of computer-readable storage medium unless otherwise specified. A computer-readable storage medium may store instructions for execution by at least one processor, including instructions for causing the processor to perform steps or stages consistent with embodiments herein. Additionally, one or more computer-readable storage media may be utilized in implementing a computer-implemented method. The term "non-transitory computer-readable storage medium" should be understood to include tangible items and exclude carrier waves and transient signals.

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

In the foregoing specification, embodiments have been described with reference to numerous specific details that can vary from implementation to implementation. Certain adaptations and modifications of the described embodiments can be made. Other embodiments can be apparent to those skilled in the art from consideration of the specification and practice of the invention disclosed herein. It is intended that the specification and examples be considered as exemplary only, with a true scope and spirit of the invention being indicated by the following claims. It is also intended that the sequence of steps shown in figures are only for illustrative purposes and are not intended to be limited to any particular sequence of steps. As such, those skilled in the art can appreciate that these steps can be performed in a different order while implementing the same method.

What is claimed is:

1. A processing in memory (PIM) enabled device for executing a neural network model, comprising:
a memory block assembly with a plurality of rows, comprising:
 a first array of memory blocks arranged within the plurality of rows;
 a second array of memory blocks arranged within the plurality of rows adjacent to the first array of memory blocks;
 a plurality of first data links associated with the first array of memory blocks and the second array of memory blocks, wherein each data link of the plurality of first data links communicatively couples two corresponding memory blocks of a same row of the plurality of rows from the first array of memory blocks and the second array of memory blocks respectively; and
 a second data link comprising two parallel column data links arranged between the first array of memory blocks and the second array of memory blocks and directly communicatively coupled to the plurality of first data links, respectively,
 wherein data from a first memory block of a first row of the first array of memory blocks is transferable to a second memory block of a second row different from the first row of the second array of memory blocks via the plurality of first data links and either or both of the two column data links of the second data link.

2. The PIM enabled device of claim 1, wherein each memory block includes a memory cell array arranged in a first plurality of rows and in a second plurality of columns.

3. The PIM enabled device of claim 1, wherein the plurality of first data links and the second data link are configured to transfer the data stored in a column of memory cells in the first memory block to a row of memory cells in the second memory block in one cycle.

4. The PIM enabled device of claim 1, wherein the memory block assembly further comprises:

a third array of memory blocks arranged within the plurality of rows adjacent to the second array of memory blocks;

a plurality of third data links associated with the second array of memory blocks and the third array of memory blocks, wherein each of data link of the plurality of third data links communicatively couples two corresponding memory blocks of a same row of the plurality of rows from the second array of memory blocks and the third array of memory blocks respectively;

a fourth data link communicatively coupled to the plurality of third data links; and a transfer buffer communicatively coupled with the second data link and the fourth data link, wherein data from the first memory block of a first row of the first array of memory blocks is transferable to a third memory block of a second row different from the first row of the third array of memory blocks via the transfer buffer.

5. The PIM enabled device of claim 4, wherein the memory block assembly further comprises:

a first buffer data link configured to communicatively couple the second data link and the transfer buffer; and a second buffer data link configured to communicatively couple the fourth data link and the transfer buffer.

6. The PIM enabled device of claim 5, wherein the memory block assembly further comprises:

a first switch configured to control opening or closing a data path from the first memory block to a first data link communicatively coupled with the first memory block among the plurality of first data links;

a second switch configured to control opening or closing a data path from the first buffer data link to the transfer buffer;

a third switch configured to control opening or closing a data path from the transfer buffer to the second buffer data link; and a fourth switch configured to control opening or closing a data path from a third data link communicatively coupled with the third memory block among the plurality of third data links to the third memory block.

7. The PIM enabled device of claim 6, wherein the memory block assembly further comprises:

a first selector configured to select the first switch to open the data path from the first memory block to the first data link communicatively coupled with the first memory block;

a second selector configured to select the second switch to open the data path from the first buffer data link to the transfer buffer;

a third selector configured to select the third switch to open the data path from the transfer buffer to the second buffer data link and a fourth selector configured to select the fourth switch to open the data path from the third data link communicatively coupled with the third memory block to the third memory block.

8. The PIM enabled device of claim 4, wherein each memory block includes a memory cell array arranged in a first plurality of rows and in a second plurality of columns.

9. The PIM enabled device of claim 4, wherein the plurality of first data links, the second data link, and the first buffer data link are configured to transfer the data stored in a column of memory cells in the first memory block to a row of memory cells in the transfer buffer in one cycle.

10. The PIM enabled device of claim 9, wherein the second buffer data link, the fourth data link, and the plurality of third data links are configured to transfer the data stored in the row of memory cells in the transfer buffer to a row of memory cells in the third memory block in another cycle.

11. The PIM enabled device of claim 1, further comprising a block table for recording a status for each memory block in the memory block assembly, wherein the status includes computing status indicating a corresponding memory block is executing an assigned operation, ready status indicating a corresponding memory block has data ready for being transferred, and an idle status indicating a corresponding memory is ready for receiving data.

12. The PIM enabled device of claim 1, further comprising a data transfer table for recording pending data transfer in the memory block assembly, wherein the data transfer table includes a source field indicating a memory block sending data and a destination field indicating a memory block receiving the data.

13. The PIM enabled device of claim 12, wherein the data transfer table further includes a buffer field indicating a buffer the data resides in.

14. The PIM enabled device of claim 1, further comprising a controller configured to provide commands to the memory block assembly to execute a first operation of the neural network model on the first memory block and a second operation of the neural network model on the second memory block, the second operation uses output data from execution of the first operation as an input.

15. The PIM enabled device of claim 1, wherein the memory block assembly further comprises:

a first switch configured to control opening or closing a data path from the first memory block to a first data link communicatively coupled with the first memory block among the plurality of first data links; and a second switch configured to control opening or closing a data path from a first data link communicatively coupled with the second memory block among the plurality of first data links to the second memory block.

16. A method for executing a neural network model on a processing in memory (PIM) enabled device comprising a memory block assembly, comprising:

processing a first operation of the neural network model on a first memory block of a first array of memory blocks in the memory block assembly comprising the first array of memory blocks and a second array of memory blocks that are arranged within a plurality of rows;

transferring output data from the first memory block of a first row of the plurality of rows to a second memory block of a second row of the plurality of rows of the second array of memory blocks via data links communicatively coupling the first memory block and the second memory in the memory block assembly depending on the first row and the second row, wherein the data links comprises a plurality of first data links and a second data link communicatively coupled to the plurality of first data links, the second data link comprising two parallel column data links arranged between the first array of memory blocks and the second array of memory blocks and directly communicatively coupled to the plurality of first data links, respectively, and transferring output data is performed in one or more cycles depending on a size of the output data and available memory in source and destination block; and processing, on the second memory block, a second operation of the neural network model based on the output data.

17. The method of claim 16, further comprising:
transferring the output data from the first memory block to a third memory block of the second array of memory blocks; and
processing, on the third memory block, a third operation of the neural network model based on the output data,
wherein transferring the output data from the first memory block to the third memory block is performed after or during a time period of transferring the output data from the first memory block to the second memory block.

18. The method of claim 16, wherein transferring output data comprises:
transferring the output data from the first memory block to a transfer buffer in the memory block assembly; and
transferring the output data from the transfer buffer to the second memory block,
wherein the transfer buffer is communicatively coupled with the first memory block and the second memory block.

19. The method of claim 16, wherein transferring output data comprises:
transferring the output data stored in a column of memory cells in the first memory block to a row of memory cells in the second memory block.

20. The method of claim 16, further comprising:
recording a status for each memory block in the memory block assembly in a block table,
wherein the status includes a computing status indicating a corresponding memory block is executing an assigned operation, a ready status indicating a corresponding memory block has data ready for being transferred, and an idle status indicating a corresponding memory is ready for receiving data.

21. The method of claim 16, further comprising:
recording pending data transfer in the memory block assembly in a data transfer table,
wherein the data transfer table includes a source field indicating a memory block sending data and a destination field indicating a memory block receiving the data.

22. A non-transitory computer readable storage media storing a set of instructions that are executable by at least one processor of a processing in memory (PIM) enabled terminal to cause the terminal to perform a method comprising:
processing a first operation of the neural network model on a first memory block of a first array of memory blocks in a memory block assembly comprising the first array of memory blocks and a second array of memory blocks that are arranged within a plurality of rows;
transferring output data from the first memory block of a first row of the plurality of rows to a second memory block of a second row of the plurality of rows of the second array of memory blocks via data links communicatively coupling the first memory block and the second memory in the memory block assembly depending on the first row and the second row, wherein the data links comprises a plurality of first data links and a second data link communicatively coupled to the plurality of first data links, the second data link comprising two parallel column data links arranged between the first array of memory blocks and the second array of memory blocks and communicatively coupled to the plurality of first data links, respectively, and transferring output data is performed in one or more cycles depending on a size of the output data and available memory in source and destination block; and
processing, on the second memory block, a second operation of the neural network model based on the output data.

23. The computer readable medium of claim 22, wherein the set of instructions that is executable by at least one processor of the terminal to cause the terminal to further perform:
transferring the output data from the first memory block to a third memory block of the second array of memory blocks; and
processing, on the third memory block, a third operation of the neural network model based on the output data,
wherein transferring the output data from the first memory block to the third memory block is performed after or during a time period of transferring the output data from the first memory block to the second memory block.

24. The computer readable medium of claim 22, wherein the set of instructions that is executable by at least one processor of the terminal to cause the terminal to further perform:
transferring the output data from the first memory block to a transfer buffer in the memory block assembly; and
transferring the output data from the transfer buffer to the second memory block,
wherein the transfer buffer is communicatively coupled with the first memory block and the second memory block.

25. The computer readable medium of claim 22, wherein transferring output data comprises:
transferring the output data stored in a column of memory cells in the first memory block to a row of memory cells in the second memory block.

26. The computer readable medium of claim 22, wherein the set of instructions that is executable by at least one processor of the terminal to cause the terminal to further perform:
recording a status for each memory block in the memory block assembly in a block table,
wherein the status includes a computing status indicating a corresponding memory block is executing an assigned operation, a ready status indicating a corresponding memory block has data ready for being transferred, and an idle status indicating a corresponding memory is ready for receiving data.

27. The computer readable medium of claim 22, wherein the set of instructions that is executable by at least one processor of the terminal to cause the terminal to further perform:
recording pending data transfer in the memory block assembly in a data transfer table,
wherein the data transfer table includes a source field indicating a memory block sending data and a destination field indicating a memory block receiving the data.

28. A terminal, comprising:
a host unit; and
a processing in memory (PIM) enabled device communicatively coupled to the host unit, the PIM enabled device comprising:
a memory block assembly with a plurality of rows, comprising:

a first array of memory blocks arranged within the plurality of rows;

a second array of memory blocks arranged within the plurality of rows adjacent to the first array of memory blocks;

a plurality of first data links associated with the first array of memory blocks and the second array of memory blocks, wherein each data link of the plurality of first data links communicatively couples two corresponding memory blocks of a same row of the plurality of rows from the first array of memory blocks and the second array of memory blocks respectively; and a second data link communicatively coupled to the plurality of first data links, the second data link comprising two parallel column data links arranged between the first array of memory blocks and the second array of memory blocks and directly communicatively coupled to the plurality of first data links, respectively, wherein data from a first memory block of a first row of the first array of memory blocks is transferable to a second memory block of a second row different from the first row of the second array of memory blocks via the plurality of first data links and either or both of the two column data links of the second data link.

29. The PIM enabled device of claim 28, wherein the memory block assembly further comprises:

a first selector configured to select the first switch to open the data path from the first memory block to the first data link communicatively coupled with the first memory block; and a second selector configured to select the second switch to open the data path from the first data link communicatively coupled with the second memory block to the second memory block.

* * * * *